United States Patent
Hase

[19]

[11] Patent Number: 5,844,286
[45] Date of Patent: Dec. 1, 1998

[54] SEMICONDUCTOR ACCELERATION SENSOR

[75] Inventor: Yuji Hase, Tokyo, Japan

[73] Assignee: Mitsubishi Denki Kabushiki Kaisha, Tokyo, Japan

[21] Appl. No.: 773,257

[22] Filed: Dec. 23, 1996

[30] Foreign Application Priority Data

Jun. 14, 1996 [JP] Japan ..................................... 8-154618

[51] Int. Cl.$^6$ ................................................... H01L 29/82
[52] U.S. Cl. .............................. 257/417; 257/415; 438/52
[58] Field of Search ........................ 73/504.15; 257/415, 257/417, 418; 438/52

[56] References Cited

U.S. PATENT DOCUMENTS

| | | | |
|---|---|---|---|
| 4,571,661 | 2/1986 | Hoshino | 361/283 |
| 5,006,487 | 4/1991 | Stokes | 438/52 |
| 5,231,879 | 8/1993 | Yamamoto | 73/517 R |
| 5,508,231 | 4/1996 | Ball et al. | 438/123 |
| 5,572,057 | 11/1996 | Yamamoto et al. | 257/417 |
| 5,587,343 | 12/1996 | Kano et al. | 438/52 |

FOREIGN PATENT DOCUMENTS 2-134570  5/1990  Japan .

*Primary Examiner*—Mahshid D. Saadat
*Assistant Examiner*—Allan R. Wilson
*Attorney, Agent, or Firm*—Sughrue, Mion, Zinn, Macpeak & Seas, PLLC

[57] ABSTRACT

A semiconductor acceleration sensor of a single integral type has a semiconductor substrate, a first nitride layer, a first poly-silicon layer, a second nitride layer, a second poly-silicon layer, a third nitride layer and a third poly-silicon layer which are fabricated in order. A movable section is formed in a part of the second poly-silicon layer placed in a cavity enclosed and sealed by the first nitride layer, the first poly-silicon layer, the second nitride layer, the second poly-silicon layer, the third nitride layer and the third poly-silicon layer. A fabrication method of the semiconductor acceleration sensor of a single integral type is also disclosed.

19 Claims, 18 Drawing Sheets

SEMICONDUCTOR ACCELERATION SENSOR

SEMICONDUCTOR ACCELERATION SENSOR

SEMICONDUCTOR ACCELERATION SENSOR

BACKGROUND OF THE INVENTION

1. Field of the Invention

The present invention relates to a small-sized semiconductor acceleration sensor of a single integral structure, having a higher impact strength, for detecting the magnitude of an acceleration generated when an automobile collides with an object, or the magnitude of an acceleration of a device, for example, mounted on automobiles, apparatuses, devices and so on, and a fabrication method of the semiconductor acceleration sensor.

2. Description of the Prior Art

Acceleration sensors of an electro-static capacity type and pressure sensors of a strain gage type are mounted on automobiles as control devices in order to control a body control of the automobile and to control the operation of an engine in the automobile.

There is an acceleration sensor disclosed in the literature, Japanese laid-open publication number 2-134570, as an example of the acceleration sensors described above.

FIG. 29 is a sectional diagram showing a semiconductor acceleration sensor disclosed in the literature of the Japanese laid-open publication number 2-134570 described above. In FIG. 29, the reference numbers 41, 42 and 43 designate silicon substrates which are directly laminated to each other through electrical insulating oxide films 44 and 45 by using an anode connection method. The reference numbers 46 and 47 denotes a silicon beam and a movable electrode, respectively. These silicon beam 46 and the movable electrode 47 are formed in a cavity formed by etching the silicon substrate 42.

Next, the operation of the conventional semiconductor acceleration sensor shown in FIG. 29 will now be explained.

In the conventional semiconductor acceleration sensor shown in FIG. 29, a magnitude of an electro-static capacitance in the cavity 48 formed between the movable electrode 47 and the silicon substrate 41 is changed in proportion to a change of magnitude of an acceleration applied to the semiconductor acceleration sensor itself.

That is, the magnitude of the acceleration applied to a device incorporating the conventional semiconductor acceleration sensor can be detected based on the magnitude of a change of the electro-static capacitance.

Since the conventional semiconductor acceleration sensor has the above configuration shown in FIG. 29, it must be required to form the silicon substrates 41 and 43 as the fixed electrodes connected to and adhered on the upper section and the lower section of the silicon substrate 42 in addition to the silicon substrate 42. Accordingly, it must be required to perform additional other fabrication processes for connecting the silicon substrates 41 and 43 with the silicon substrate 42 other than usual semiconductor fabrication processes. Therefore it take many times to fabricate the conventional acceleration sensor having the configuration shown in FIG. 29 and the manufacturing cost of the semiconductor acceleration sensor becomes high. Furthermore, there is the drawback that the movable electrode 47 is easily damaged during the connection process for the silicon substrates 41, 42 and 43, so that there is the drawback in the prior art that the yield rate of the conventional semiconductor acceleration sensors becomes low.

SUMMARY OF THE INVENTION

Accordingly, an object of the present invention is, with due consideration to the drawbacks of the conventional semiconductor acceleration sensor, to provide a semiconductor acceleration sensor of a small-sized and of a single integral structure having a high performance such as a high impact strength, a high sensitivity and to provide a semiconductor fabrication method of fabricating the semiconductor accelerator device.

In accordance with a preferred embodiment of the present invention, a semiconductor acceleration sensor comprises: a first insulating layer, a first poly-silicon layer, a second insulating layer, a second poly-silicon layer, a third insulating layer and a third poly-silicon layer in a single integral structure. A movable section is formed in a part of the second poly-silicon layer. The movable section is also enclosed and sealed in a cavity section formed by the first insulating layer, the first poly-silicon layer, the second insulating layer, the second poly-silicon layer, the third insulating layer and the third poly-silicon layer. Therefore the semiconductor acceleration sensor of the present invention can be formed in a small circuit size and has a high impact strength and the movable section can detect a magnitude of change of acceleration applied to the semiconductor acceleration sensor with a high sensitivity.

In accordance with another preferred embodiment of the present invention, a fabrication method of a semiconductor acceleration sensor forms a first insulating layer, a first poly-silicon layer, a first oxide film, a second insulating layer, a second poly-silicon layer, a second oxide film, a third insulating layer and a third poly-silicon layer in order by using a semiconductor fabrication processes. Further, the first oxide film and the second oxide film are removed through an etching hole by using an etching process at the same time in order to form a movable section in a cavity section. Finally, the etching hole is sealed in order to seal the cavity section. Thereby, a semiconductor acceleration sensor can be formed efficiently in a single integral structure with a high yield rate.

In accordance with another preferred embodiment of the present invention, a semiconductor acceleration device has a configuration in which the semiconductor acceleration sensor according to the present invention and an integrated circuit are formed in a same semiconductor substrate in a single integral structure. Thereby, the semiconductor integrated circuit can receive output transferred from the semiconductor acceleration sensor directly and immediately and can amplify this output efficiently.

In accordance with another preferred embodiment of the present invention, a semiconductor acceleration sensor can detect a magnitude of acceleration applied to the semiconductor acceleration sensor by detecting a magnitude of an electro-static capacity between a movable electrode and a fixed electrode.

In accordance with another preferred embodiment of the present invention, a semiconductor acceleration sensor has a configuration in which one end section of the movable section is supported by a pair of cross-link sections. Thereby, a magnitude of acceleration applied to the semiconductor acceleration sensor can be detected with a high sensitivity.

In accordance with another preferred embodiment of the present invention, a semiconductor acceleration sensor having a configuration in which a left movable electrode and a right movable electrode are formed at both end sections of the second poly-silicon layer, a left fixed electrode and a right fixed electrode are formed in the first poly-silicon layer corresponding to the left movable electrode and the right movable electrode, respectively, and the movable sections as an intermediate section of the second poly-silicon layer is supported by the second insulating layer. Thereby, a magnitude of acceleration applied to the semiconductor acceleration sensor can be detected by the left and right movable electrodes and the left and right fixed electrodes with a high sensitivity.

In accordance with another preferred embodiment of the present invention, a semiconductor acceleration sensor having a configuration in which four-end sections of the movable electrode are supported by a plurality of supporting sections. Thereby, a magnitude of acceleration applied to the semiconductor acceleration sensor can be detected with a high sensitivity.

In accordance with another preferred embodiment of the present invention, a semiconductor acceleration sensor having a configuration in which a movable electrode is formed at a part of the movable section in the second poly-silicon layer, a lower side fixed electrode is formed at a part of the first poly-silicon layer at a position corresponding to the movable electrode, an upper side fixed electrode is formed at a part of the third poly-silicon layer at a position corresponding to the movable electrode. Thereby, a magnitude of acceleration applied to the semiconductor acceleration sensor can be detected based on a magnitude of change of an electro-static capacitance between the movable electrode and the upper side fixed electrode and between the movable electrode and the lower side fixed electrode.

In accordance with another preferred embodiment of the present invention, a semiconductor acceleration sensor having a configuration in which an impurity diffusion resistance section is formed at a part of the movable section. Thereby, a magnitude of acceleration applied to the semiconductor acceleration sensor is detected with a high sensitivity based on a magnitude of change of a resistance value of the impurity diffusion resistance section.

In accordance with another preferred embodiment of the present invention, a semiconductor acceleration sensor having a configuration in which a thickness of the impurity diffusion resistance section is thinner, as a thinner section, than a thickness of a section in the second poly-silicon layer in which no impurity diffusion resistance section is formed. Thereby, a magnitude of acceleration applied to the semiconductor acceleration sensor is detected with a high sensitivity.

In accordance with another preferred embodiment of the present invention, a semiconductor acceleration sensor having a configuration in which a lower side fixed electrode is formed in the first poly-silicon layer, a movable electrode is formed in the second poly-silicon layer, an upper side fixed electrode is formed in the third poly-silicon layer, and wirings are formed in the first poly-silicon layer, the second poly-silicon layer and the third poly-silicon layer by diffusing impurity. Thereby, a magnitude of acceleration applied to the semiconductor acceleration sensor can be detected based on a magnitude of change of an electro-static capacitance between the movable electrode and the upper side fixed electrode and between the movable electrode and the lower side fixed electrode with a high sensitivity.

In accordance with another preferred embodiment of the present invention, a semiconductor acceleration sensor having a configuration in which, a movable electrode is formed at a part of the movable section in the second poly-silicon layer, a fixed electrode is formed in the first poly-silicon layer, a driving electrode separated from the fixed electrode in the first poly-silicon layer in distance is formed in the first poly-silicon layer. Thereby, the semiconductor acceleration sensor has a self-checking function and detects a damage of the movable electrode based on a magnitude of change of an electro-static capacitance between the movable electrode and the fixed electrode generated when a voltage is applied to the driving electrode.

In accordance with another preferred embodiment of the present invention, a semiconductor acceleration sensor having a configuration in which, an impurity diffusion resistance section is formed in the second poly-silicon layer by diffusing impurity, and a fixed electrode (a driving electrode) is formed in the first poly-silicon layer. Thereby, the semiconductor acceleration sensor has a self-checking function and can detect a damage of the movable electrode by measuring a magnitude of change of a resistance value of the impurity diffusion resistance section when a voltage is applied to the fixed electrode.

In accordance with another preferred embodiment of the present invention, a semiconductor acceleration sensor having a configuration in which, a driving electrode is formed in the third poly-silicon electrode, the semiconductor acceleration sensor has a self-checking function and can detect a damage of the movable electrode by measuring a magnitude of change of an electro-static capacitance between the movable electrode and the fixed electrode formed in the first poly-silicon layer generated when a voltage is applied to the driving electrode.

In accordance with another preferred embodiment of the present invention, a semiconductor acceleration sensor having a configuration in which, a lower side fixed electrode is formed and a driving electrode separated from the lower side fixed electrode in distance is formed in the first poly-silicon layer, a movable electrode is formed in the second poly-silicon layer, an upper side fixed electrode is formed in the third poly-silicon layer, wirings are formed by diffusing impurity in the first poly-silicon layer, the second poly-silicon layer, and the third poly-silicon layer. Thereby, the semiconductor acceleration sensor has a self-checking function and can detect a damage of the movable electrode by measuring a magnitude of change of an electro-static capacitance between the movable electrode and the upper side fixed electrode and between the movable electrode and the lower side fixed electrode when a voltage is applied to the driving electrode formed in the first poly-silicon layer which is separated in distance from the lower side fixed electrode in the first poly-silicon layer.

In accordance with another preferred embodiment of the present invention, the semiconductor acceleration sensor chip comprises: the semiconductor acceleration sensor according to the present invention formed in a semiconductor substrate, or comprises: the semiconductor acceleration sensor according to the present invention and integrated circuit formed in a same semiconductor substrate in a single integral structure in which lead frames are connected to the semiconductor acceleration sensor by wire bonds and the semiconductor acceleration sensor, the semiconductor integrated circuit and the wire bonds and the lead frames are sealed with a resin mold in a package. Thereby, the semiconductor acceleration sensor chip can be formed with a small-sized structure and a high impact strength.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of a semiconductor acceleration sensor and a semiconductor fabrication method according to the present invention will now be described with reference to the drawings.

Embodiment 1

Figure 1:
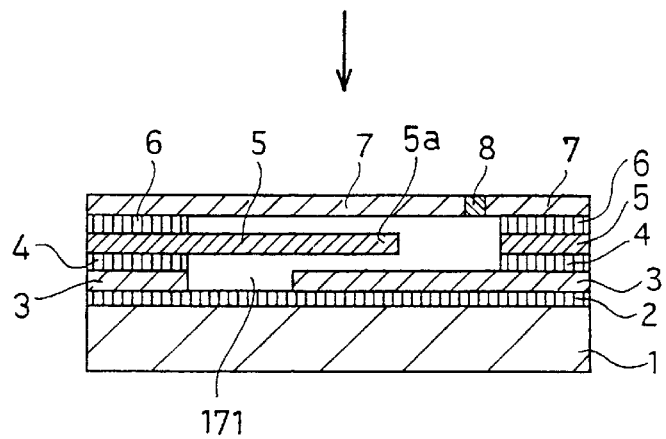
FIG. 1 is a sectional view of a semiconductor acceleration sensor of the first embodiment according to the present invention.

FIG. 1 is a sectional view of a semiconductor acceleration sensor of the first embodiment according to the present invention. In the diagram, the reference number 1 designates a semiconductor silicon substrate (a semiconductor substrate), 2 denotes a first nitride layer (a first insulating layer) as an insulating layer formed on a surface of the semiconductor silicon substrate 1, 3 indicates a first poly-silicon layer formed on the first nitride layer 2, 4 indicates a second nitride layer (a second insulating layer) formed on the first poly-silicon layer 3, 5 designates a second poly-silicon layer formed on the second nitride layer 4, and 5a indicates a movable section as a part of the second poly-silicon layer 5, whose surface is enclosed by a cavity 171.

The movable section 5a is changed in position according to a magnitude of change of the acceleration applied to the semiconductor acceleration sensor. The reference number 6 designates a third nitride layer (a third insulating layer) formed on the second poly-silicon layer, 7 denotes a third poly-silicon layer formed on the third nitride layer 6, and 8 indicates a sealed section sealed with a poly-silicon in an etching hole formed on the third poly-silicon layer 7.

Figure 29:
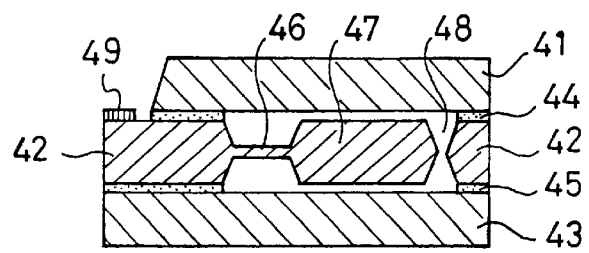
FIG. 29 is a sectional view of a conventional semiconductor acceleration sensor.

The semiconductor acceleration sensor of the first embodiment, specifically the second poly-silicon layer 5 having the movable section 5a, can be fabricate by using usual semiconductor fabrication processes without any special fabrication processes or additional fabrication processes such as an anode connection process which must be required to fabricate the conventional semiconductor acceleration sensor shown in FIG. 29. That is, as shown in FIGS. 2 to 4, the first poly-silicon layer 3, the second poly-silicon layer 16 and the third poly-silicon layer 19 are formed in order by using semiconductor fabrication processes, and then the first nitride layer 14 and the second oxide film 17 are removed by an etching process so that the movable section 5a is formed at the same time. Accordingly, the semiconductor acceleration sensor of a small sized structure having a high impact strength according to the first embodiment can be fabricated easily by simple semiconductor fabrication processes.

Next, the operation of the semiconductor acceleration sensor of the first embodiment will now be explained.

In the semiconductor acceleration sensor of the first embodiment shown in FIG. 1, when acceleration designated by the arrow is applied to the semiconductor acceleration sensor, the position of the movable section 5a is changed according to the magnitude of acceleration. This change of the movable section 5a in position causes the change of electro-static capacitance between the first poly-silicon layer 3 and the third poly-silicon layer 7 and the second poly-silicon layer 5. The change of the electro-static capacitance is converted to an electrical signal in order to detect the magnitude of acceleration applied to the semiconductor acceleration sensor.

Next, a fabrication method of the semiconductor acceleration sensor of the first embodiment according to the present invention will now be explained.

FIGS. 2A to 2F are explanation diagrams showing a fabrication method of the semiconductor acceleration sensor shown in FIG. 1. Numbers enclosed in parentheses indicate the constituent elements used in the semiconductor acceleration sensor shown in FIG. 1. FIGS. 3A to 3E are explanation diagrams showing a fabrication method of the semiconductor acceleration sensor shown in FIG. 1, and FIGS. 4A to 4D are explanation diagrams showing a fabrication method of the semiconductor acceleration sensor shown in FIG. 1.

Figure 2A:
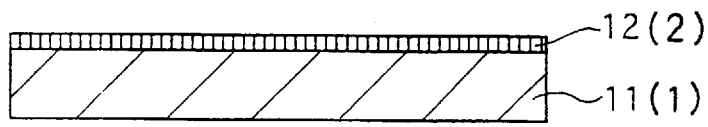
FIGS. 2A to 2F are explanation diagrams showing a fabrication method of the semiconductor acceleration sensor shown in FIG. 1.

First, a first nitride film 12 (the first insulating layer 2) is deposited on a semiconductor silicon substrate (the semiconductor substrate 1) (see FIG. 2A).

Figure 2B:
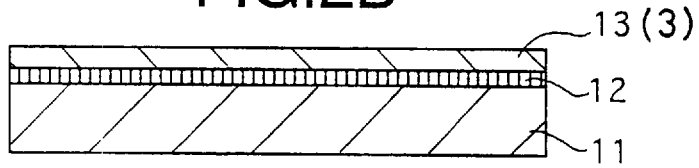

Next, a first poly-silicon layer 13 (3) is formed on the first nitride layer 12 (see FIG. 2B).

Figure 2C:
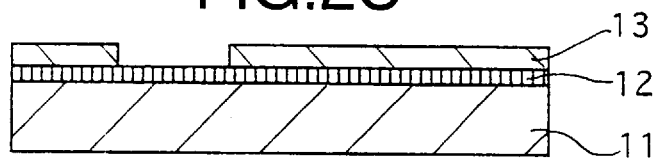
Figure 2D:
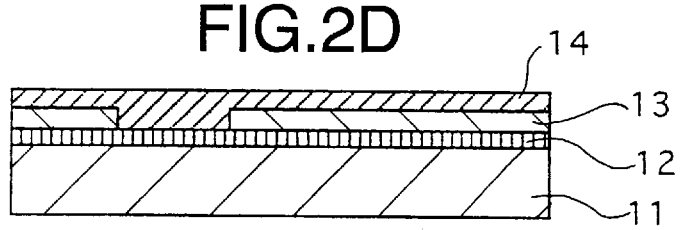

A part of the first poly-silicon layer 13 is removed by using an etching process (see FIG. 2C).

Figure 2E:
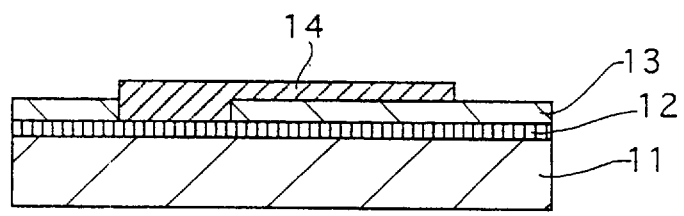
Figure 2F:
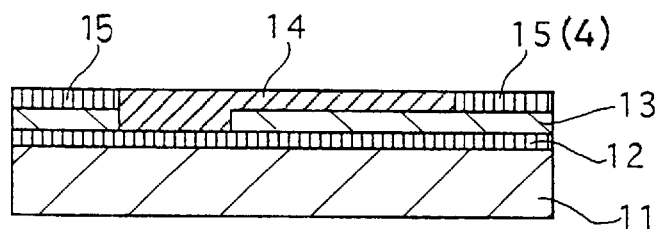

Next, a first oxide film 14 is deposited on the first nitride layer 12 and the first poly-silicon layer 13 (see FIG. 2D), a part of the first oxide film 14 is removed so that a cavity 171 shown in FIG. 1 is formed (see FIG. 2E).

Next, a second nitride layer 15 (the second insulating layer 4) is deposited on the first poly-silicon layer 13 and then a part of a surface of the first oxide film 14 and a part of a surface of the second nitride film 15 are removed by an etching process. Thereby, both surfaces of the first oxide film 14 and the second nitride film 15 are uniform (see FIG. 2F).

Figure 3A:
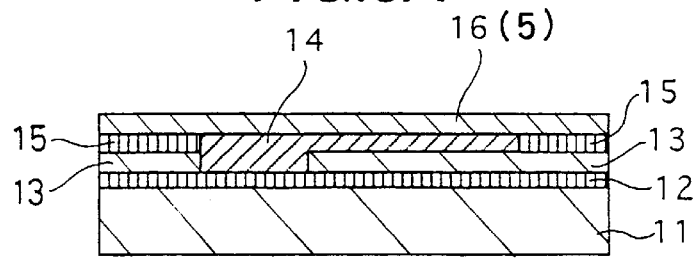
FIGS. 3A to 3E are explanation diagrams showing a fabrication method of the semiconductor acceleration sensor shown in FIG. 1.
Figure 3B:
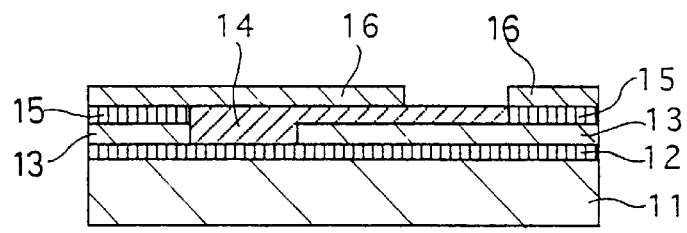

Next, a second poly-silicon layer 16 (5) is deposited on both of the first oxide film 14 and the second nitride film 15 (see FIG. 3A). Then, a part of the second poly-silicon layer 16 is removed by using an etching process in order to form a movable section 5a (see FIG. 3B).

Figure 3C:
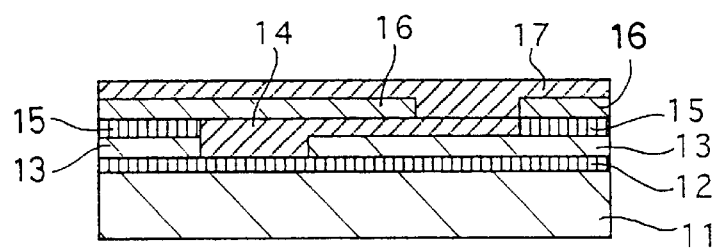
Figure 3D:
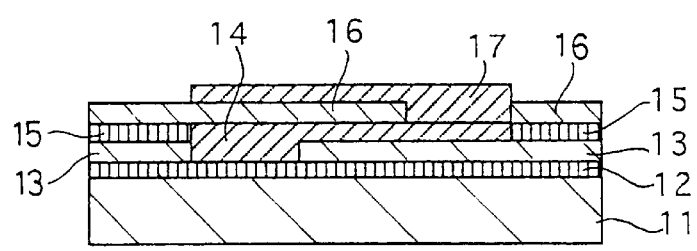
Figure 3E:
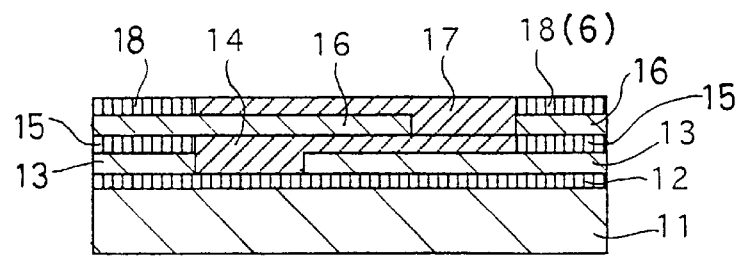

A second oxide film 17 is deposited on both the first oxide film 14 and the second poly-silicon layer 16 (see FIG. 3C). Then, a part of the second oxide film 17 is removed by an etching process in order to form the cavity 171 (see FIG. 3D).

Next, a third nitride film 18 (the third insulating layer 6) is deposited on the second poly-silicon layer 16, and then the third nitride film 18 on the surface of the second oxide film 17 is removed by an etching process. Thereby, both surfaces of the second oxide film 17 and the third nitride film 18 are uniform, namely have a same flatted surface (see FIG. 3E).

Figure 4A:
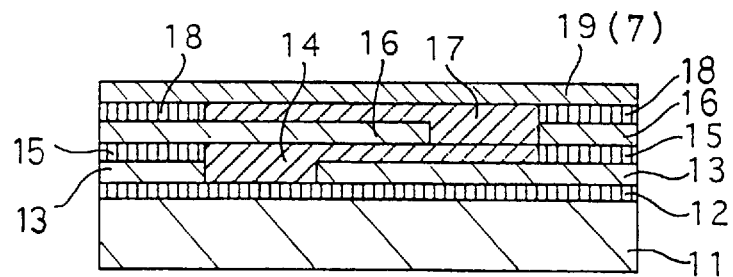
FIGS. 4A to 4D are explanation diagrams showing a fabrication method of the semiconductor acceleration sensor shown in FIG. 1.

Next, a third poly-silicon layer 19 (7) is deposited on the second oxide film 17 and the third nitride film 18 (see FIG. 4A).

Figure 4B:
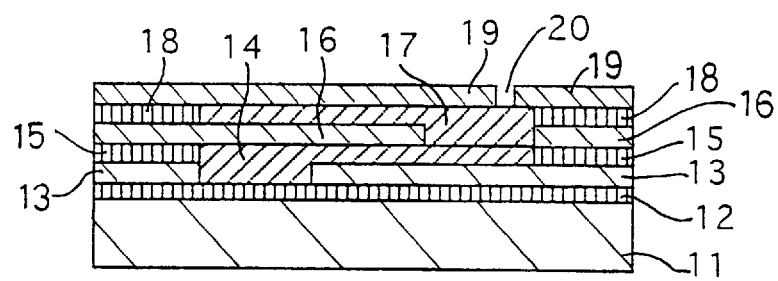
Figure 4C:
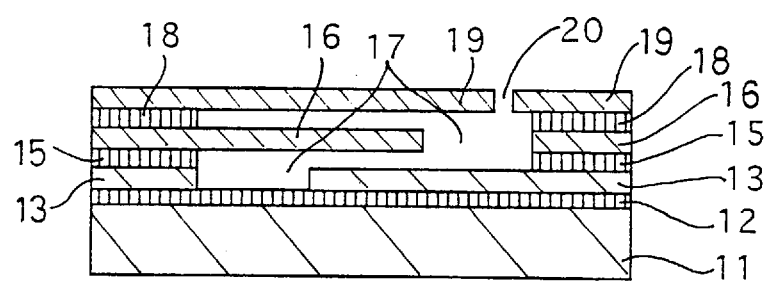

An etching hole 20 is formed in a part of the third poly-silicon layer 19 (see FIG. 4B). Through the etching hole 20, the first oxide film 14 and the second oxide film 17 are removed by using a fluorine vapor etching method, for example (see FIG. 4C). Thereby, the fixed electrode and the movable electrode formed by the first poly-silicon layer 13, the second poly-silicon layer and the third poly-silicon layer 19 are formed at the same time.

Figure 4D:
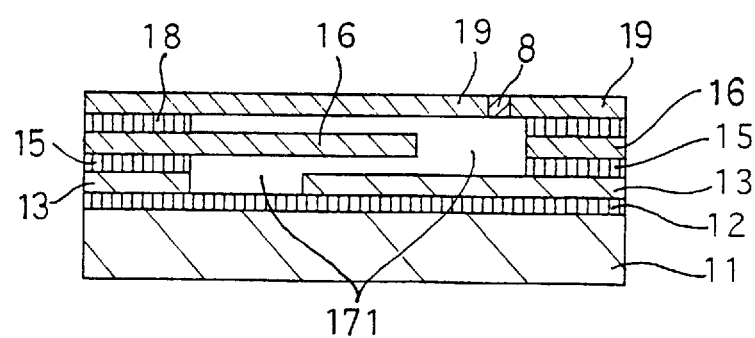

Next, a poly-silicon is deposited in the etching hole 10 to form a sealed section 8 in order to seal the cavity section 171 (see FIG. 4D).

As described above, in the semiconductor acceleration sensor and the semiconductor acceleration sensor fabrication method according to the first embodiment, the first nitride layer 12, the first poly-silicon layer 13, the first oxide film 14, the second poly-silicon layer 16, the second oxide film 17, the third poly-silicon layer 19 can be formed on the semiconductor substrate 11 sequentially in order by using a usual semiconductor fabrication processes. In addition, through the etching hole 20, the first oxide film 14 and the second oxide film 17 are removed by using the fluorine vapor etching method so that the movable section 5a in order to form the second poly-silicon layer 16. A change of the position of the movable section 5a causes to change a magnitude of an electro-static capacitance according to a magnitude of change of acceleration applied to the semiconductor acceleration sensor. Then, the etching hole 20 is sealed with a poly-silicon. Thereby, the semiconductor acceleration sensor of a single integral structure having a high impact strength can be formed.

Embodiment 2

Figure 5:
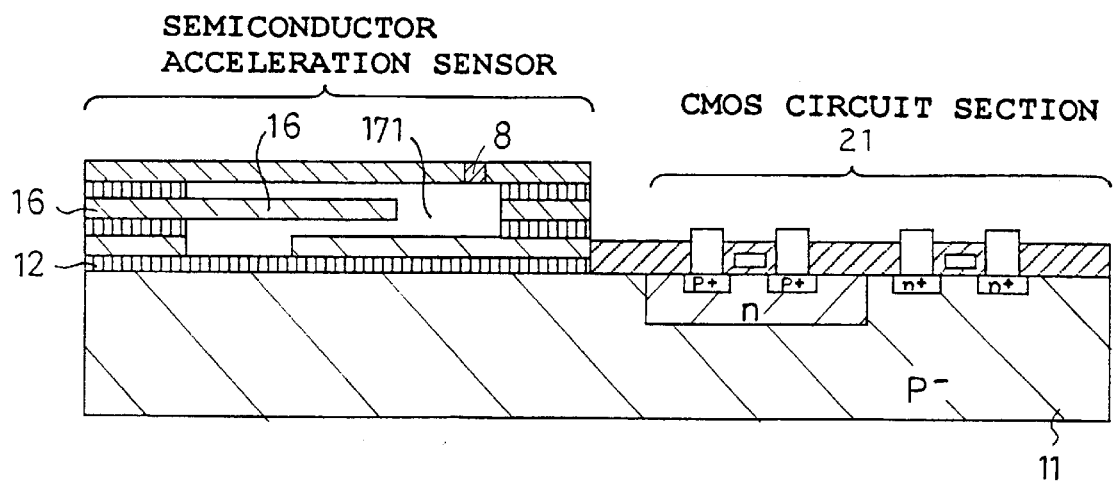
FIG. 5 is a sectional view of a semiconductor acceleration sensor of the second embodiment according to the present invention.
Figure 6:
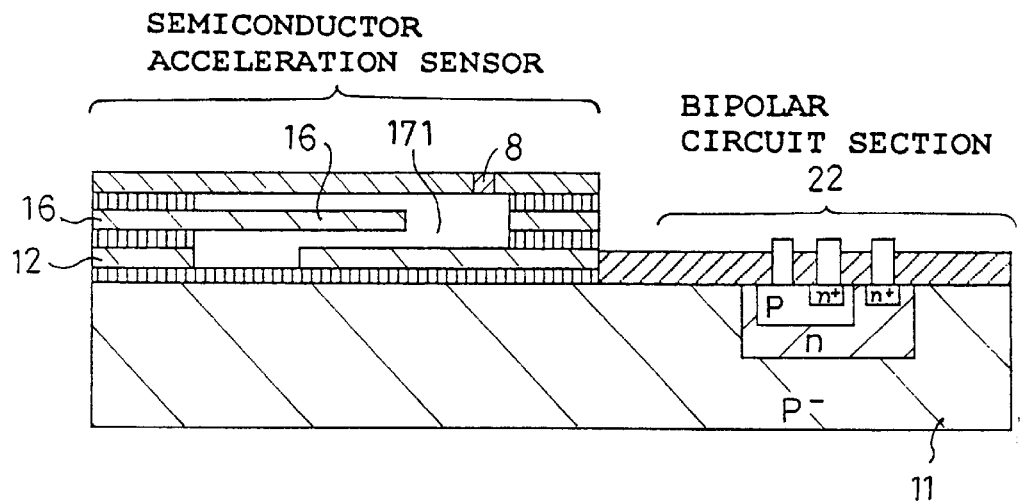
FIG. 6 is a sectional view of a semiconductor acceleration sensor of the second embodiment according to the present invention.
Figure 7:
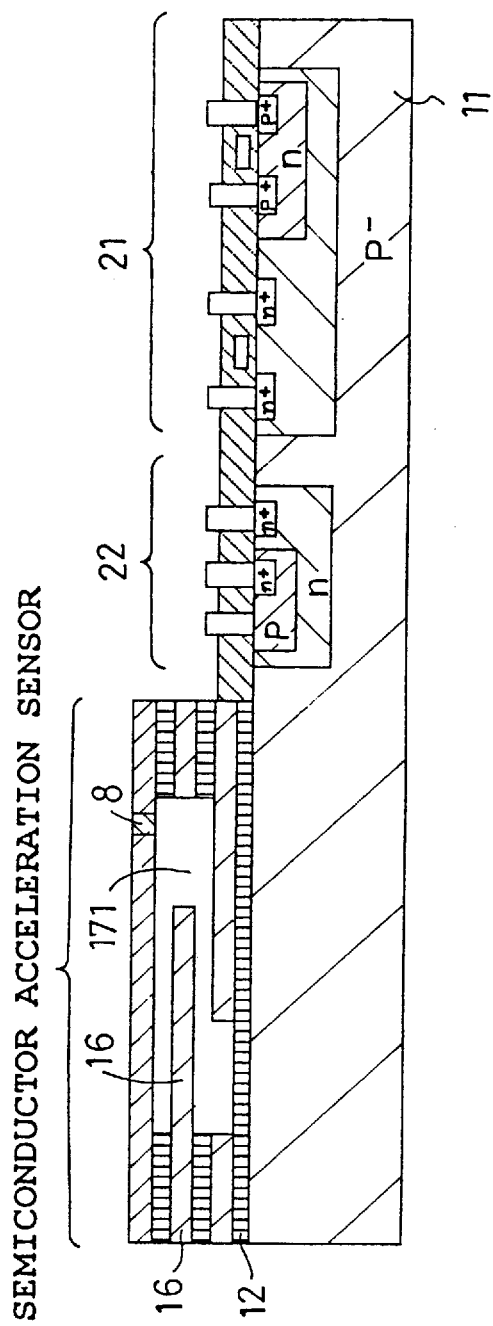
FIG. 7 is a sectional view of a semiconductor acceleration sensor of the second embodiment according to the present invention.

FIG. 5 is a sectional view of a semiconductor acceleration sensor of the second embodiment according to the present invention, FIG. 6 is a sectional view of a semiconductor acceleration sensor of the second embodiment according to the present invention, and FIG. 7 is a sectional view of a semiconductor acceleration sensor of the second embodiment according to the present invention.

In FIG. 5, the reference number 21 designates a CMOS circuit section (an integrated circuit) formed on the same semiconductor silicon substrate 11 on which the semiconductor acceleration sensor shown in FIG. 1 is also formed. In addition, as shown in FIG. 6, the reference number 22 denotes a bipolar circuit section (an integrated circuit) formed on the same semiconductor silicon substrate 11 on which the semiconductor acceleration sensor shown in FIG. 1 is also formed. FIG. 7 is a sectional diagram in which the semiconductor acceleration sensor shown in FIG. 1, the CMOS circuit section 21 shown in FIG. 5, and the bipolar circuit section 22 shown in FIG. 6 are formed on the same semiconductor substrate 11. The components in the semiconductor acceleration sensor of the second embodiment which are equal to the components shown in FIG. 1, FIGS. 2A to 2F, FIGS. 3A to 3E, and FIGS. 4A to 4D in configuration and operation are also used in the same reference numbers and explanations for those components are omitted here for brevity.

In the semiconductor acceleration sensor of the second embodiment, the CMOS circuit section 21 and the bipolar circuit section 22 are formed on the semiconductor silicon substrate 11 prior to the formation of the semiconductor acceleration sensor. Then, the semiconductor acceleration sensor is formed as a single integral structure on the same semiconductor silicon substrate.

Next, the operation of the semiconductor acceleration sensor will now be explained.

The semiconductor acceleration sensor of the second embodiment detects a magnitude of acceleration applied to the semiconductor acceleration sensor or the semiconductor acceleration device and then transfers a detected result as the output signal to the CMOS circuit section 21 and the bipolar circuit section 22. The CMOS circuit 21 and the bipolar circuit section 22 receive the output signal from the semiconductor acceleration sensor and then amplify the output signal and perform the amplified output signal in a digital processing operation and then transfer the digital processed output signal to other external devices (not shown).

As described above, by using the semiconductor acceleration device of the second embodiment, since the semiconductor acceleration sensor of the first embodiment and the IC circuit section such as the signal processing circuits and the like are formed on a same semiconductor silicon substrate 11 in a single integral structure, the CMOS circuit section or the bipolar circuit section and the like can receive directly and amplify immediately output transferred from the semiconductor acceleration sensor according to applied acceleration and then can perform the digital processing for the received and amplified output. Therefore, the present invention can provide the semiconductor acceleration sensor of a small sized structure and having a high impact strength. In addition, a package fabrication cost can be reduced by using the present invention.

Embodiment 3

Figure 8A:
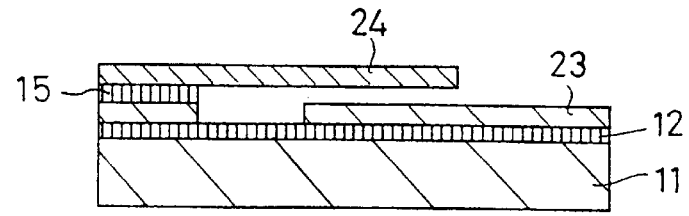
FIGS. 8A and 8B are a sectional view and a plan view of a semiconductor acceleration sensor of the third embodiment according to the present invention.
Figure 8B:
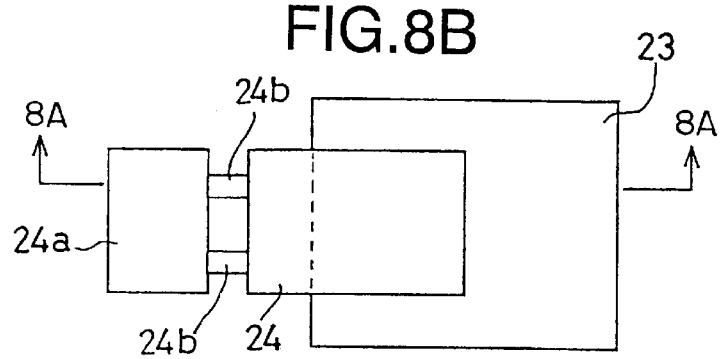
Figure 9A:
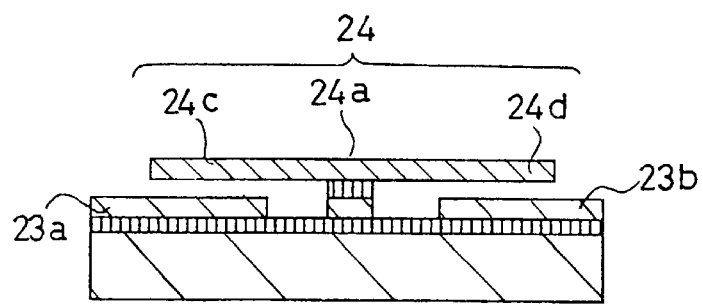
FIGS. 9A and 9B are a sectional view and a plan view of a semiconductor acceleration sensor of the third embodiment according to the present invention.
Figure 9B:
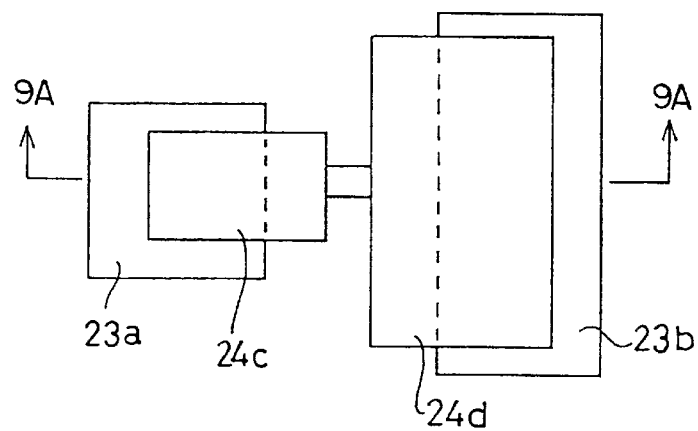
Figure 10A:
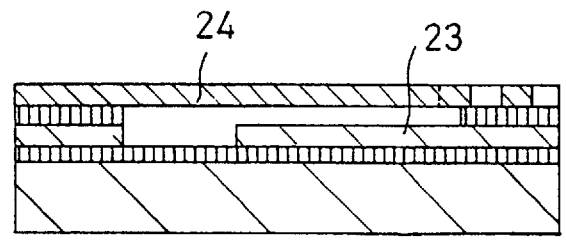
FIGS. 10A and 10B are a sectional view and a plan view, respectively, of a semiconductor acceleration sensor of the third embodiment according to the present invention.
Figure 10B:
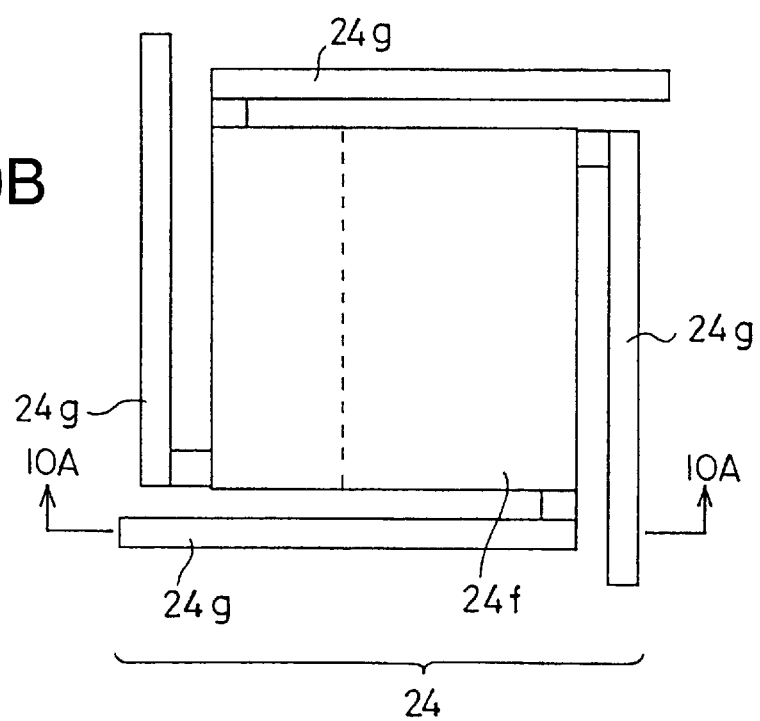

FIGS. 8A and 8B are a sectional view and a plan view of a semiconductor acceleration sensor of the third embodiment according to the present invention. FIGS. 9A and 9B are a sectional view and a plan view of a semiconductor acceleration sensor of the third embodiment according to the present invention. FIGS. 10A and 10B are a sectional view and a plan view of a semiconductor acceleration sensor of the third embodiment according to the present invention.

In FIGS. 8*a* and 8B, reference number 23 designates a fixed electrode formed in a part of the first poly-silicon layer 13, 24 denotes a movable section formed in a part of the second poly-silicon layer 16, 24*a* indicates a support section for the movable section 24, and 24*b* designates cross-link sections formed between the support section 24*a* and the movable section 24.

In FIGS. 9A and 9B, reference number 24*c* designates a left movable electrode formed the left side of the movable section 24, 24*d* denotes a right movable section formed in the right side of the movable section 24. Reference numbers 23*a* and 23*b* denote a left fixed electrode and a right fixed electrode formed corresponding to the left movable electrode 24*a* and the right movable electrode 24*b*.

In FIGS. 10A and 10B, reference number 24*f* designates a movable electrode, 24*g* denotes four support members supporting the movable electrode 24*f*. The components in the semiconductor acceleration sensor of the third embodiment which are equal to the components shown in FIGS. 2A to 2F, FIGS. 3A to 3E and FIGS. 4A to 4D in configuration and operation are also used in the same reference numbers and explanations for those components are omitted here for brevity.

In the semiconductor acceleration sensor of the third embodiment, the pair of cross-links 24*b* are formed between the movable section 24 and the support section 24. In addition, the movable electrode 24*f* is supported only by the intermediate section of the movable section 24, the left side movable electrode 24*c* and the right side movable electrode 24*d* are formed at the left side and the right side of the movable section 24, respectively. Furthermore, the movable electrode 24*f* is supported by a plurality of support sections 24*g*. By using these configurations, the semiconductor acceleration sensor of the third embodiment can detect acceleration applied to this sensor wit a high sensitively.

Next, the operation of the semiconductor acceleration sensor of the third embodiment will now be explained.

In the semiconductor acceleration sensor having the configuration shown in FIGS. 8A and 8B, the cross-link sections 24*b* are formed next to the support section 24*a* of the movable section 24. The movable section 24 can detect a magnitude of change of an electro-static capacitance generated between the fixed electrode 23 and the movable section 24. Thereby, the semiconductor acceleration sensor can detect a magnitude of acceleration applied to the semiconductor acceleration sensor based on the magnitude of the change of the electro-static capacitance.

In addition, in the semiconductor acceleration sensor having the configuration shown in FIGS. 9A and 9B, the movable section 24 is supported only by the intermediate section and the left side movable electrode 24*c* is formed at the left side of the movable section 24 corresponding to the left side fixed electrode 23*a* and the right side movable electrode 24*d* is formed at the right side of the movable section 24 corresponding to the right side fixed electrode 23*b*. In this configuration, the semiconductor acceleration sensor of the embodiment can detect a magnitude of acceleration applied to the semiconductor acceleration sensor based on the magnitude of the change of the electro-static capacitance generated between the left side fixed electrode 23*a* and the left side movable electrode 24*c* and between the right side fixed electrode 23*b* and the right side movable electrode 24*d*.

In the semiconductor acceleration sensor having the configuration shown in FIGS. 10A and 10B, the movable electrode 24*f* is supported by the four cross-link sections 24*g*. Thereby, the semiconductor acceleration sensor can detect a magnitude of acceleration applied to the semiconductor acceleration sensor with a high sensitivity based on the magnitude of change of the electro-static capacitance generated between the fixed electrode 23 and the movable electrode 24*f*.

As described above, in the semiconductor acceleration sensor of the third embodiment, the cross-link sections 24*b* are formed near to the support section of the movable section 24, or the movable section 24 is supported only at the intermediate section of the movable section 24 and the left side fixed electrode 23*a*, the right side fixed electrode 23*b*, the left side movable electrode 24*c* and the right side movable electrode 24*d* are formed, or the movable electrode 24*f* in the movable section 24 is supported by the four support sections 24*g*. Accordingly, it can be removed to twist the movable section 24 and the semiconductor acceleration sensor can detect a magnitude of acceleration applied to the semiconductor acceleration sensor with a high sensitivity based on the magnitude of the change of the electro-static capacitance generated between the fixed electrode and the movable electrode. Furthermore, the present invention provides the semiconductor acceleration sensor of a small sized structure having a high impact strength and a high sensitivity.

Embodiment 4

Figure 11A:
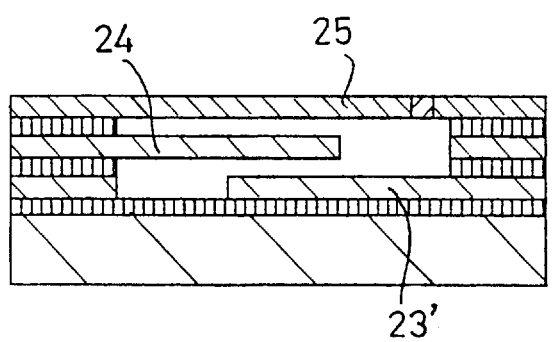
FIGS. 11A and 11B are a sectional view and a plan view of a semiconductor acceleration sensor of the fourth embodiment according to the present invention.
Figure 11B:
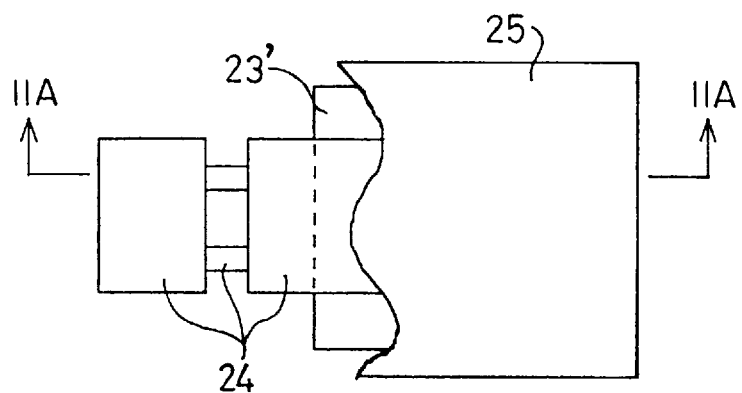

FIGS. 11A and 11B are a sectional view and a plan view of a semiconductor acceleration sensor of the fourth embodiment according to the present invention. In FIGS. 11A and 11B, reference number 23' designates a lower side fixed electrode formed in the first poly-silicon layer 13, 24 denotes a movable section, and 25 indicates an upper side fixed electrode formed in the third poly-silicon layer 19.

The components in the semiconductor acceleration sensor of the fourth embodiment which are equal, in configuration and operation, to the components used in the semiconductor acceleration sensor of the first embodiment, as shown in FIGS. 2A to 2F, FIGS. 3A to 3E and FIGS. 4A to 4D, are also used with the same reference numbers and explanations for those components are omitted here for brevity.

In the semiconductor acceleration sensor of the fourth embodiment, the lower side fixed electrode 23' is formed in the first poly-silicon layer 13 and the movable section 24 is formed in the second poly-silicon layer 16 and the upper side fixed electrode 25 is formed in the third poly-silicon layer 19. By this configuration, the semiconductor acceleration sensor of the fourth embodiment can detect a magnitude of acceleration applied to the semiconductor acceleration sensor with a high sensitivity based on a magnitude of change of an electro-static capacitance generated between the movable section 14 and the upper side fixed electrode 25 and between the movable section 24 and the lower side fixed electrode 23'.

Next, the operation of the semiconductor acceleration sensor of the fourth embodiment will now be explained.

The semiconductor acceleration sensor of the fourth embodiment detects a magnitude of acceleration applied to the semiconductor acceleration sensor based on a magnitude of change of an electro-static capacitance generated between the movable section 14 and the upper side fixed electrode 25 and between the movable section 24 and the lower side fixed electrode 23'.

As described above in detail, the semiconductor acceleration sensor of the fourth embodiment can detect a magnitude of acceleration applied to the semiconductor acceleration sensor with a high sensitivity based on a magnitude of change of an electro-static capacitance generated between the movable section 14 and the upper side fixed electrode 25 and between the movable section 24 and the lower side fixed electrode 23'. Accordingly, the sensitivity of the semiconductor acceleration sensor can be further increased. The present invention can provide the semiconductor acceleration sensor of a small sized structure having a high impact strength.

Embodiment 5

Figure 12:
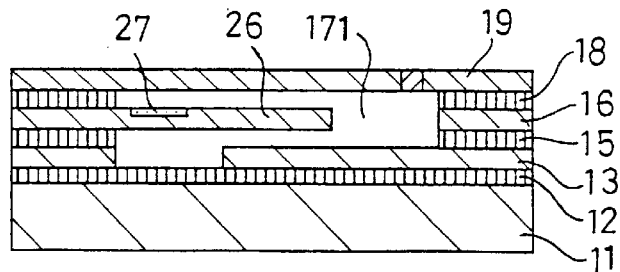
FIG. 12 is a sectional view of a semiconductor acceleration sensor of the fifth embodiment according to the present invention.
Figure 13:
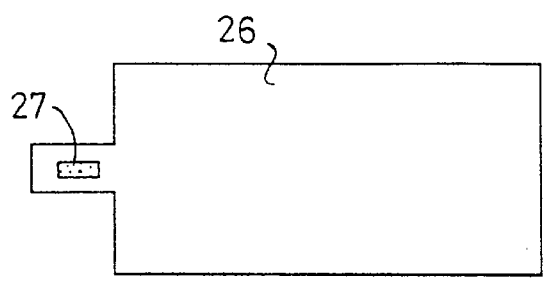
FIG. 13 is a sectional view of a semiconductor acceleration sensor of the fifth embodiment according to the present invention.
Figure 14:
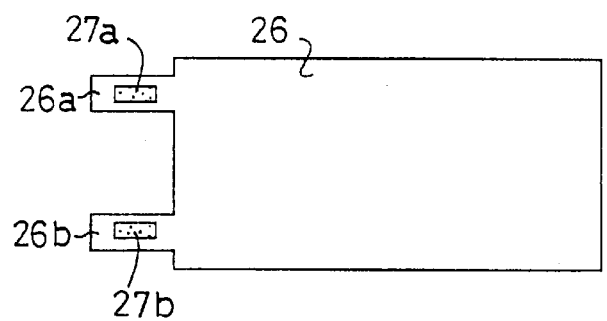
FIG. 14 is a sectional view of a semiconductor acceleration sensor of the fifth embodiment according to the present invention.
Figure 15:
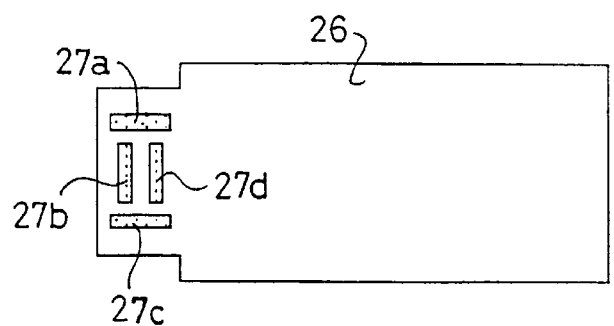
FIG. 15 is a sectional view of a semiconductor acceleration sensor of the fifth embodiment according to the present invention.

FIG. 12 is a sectional view of a semiconductor acceleration sensor of the fifth embodiment according to the present invention. FIG. 13 is a sectional view of a semiconductor acceleration sensor of the fifth embodiment according to the present invention. FIG. 14 is a sectional view of a semiconductor acceleration sensor of the fifth embodiment according to the present invention. FIG. 15 is a sectional view of a semiconductor acceleration sensor of the fifth embodiment according to the present invention.

In FIG. 12, reference number 26 designates a movable electrode formed on the second poly-silicon layer 16, 26a and 26b denote a plurality of beam sections formed in a part or one end portion of the movable section 26. Reference numbers 27, 27a to 27d designate impurity diffusion resistance sections formed by diffusing impurity into the movable section 26. The components in the semiconductor acceleration sensor of the fifth embodiment which are the same components of the semiconductor acceleration sensor of the first embodiment, as shown in FIGS. 2A to 2F, FIGS. 3A to 3E and FIGS. 4A to 4D, are also used in the same reference numbers and explanations for those components are omitted here for brevity.

In the semiconductor acceleration sensor of the fifth embodiment, the impurity diffusion resistance sections 27, 27a to 27d are formed, whose resistance value is changed according to a magnitude of acceleration applied to the semiconductor acceleration sensor. By measuring the magnitude of change of the acceleration, the semiconductor acceleration sensor can detect the magnitude of the applied acceleration with a high sensitivity.

Next, the operation of the semiconductor acceleration sensor will now be explained.

The semiconductor acceleration sensor of the fifth embodiment shown in FIG. 12 has the diffusion resistance section 27 whose resistance value is changed according to a magnitude of change of acceleration applied to a part of the movable section 26 formed in the second poly-silicon layer 16. Thereby, the semiconductor acceleration sensor can detect a magnitude of acceleration applied to the semiconductor acceleration sensor itself with a high sensitivity because the impurity diffusion resistance section 27 is formed in a part of the movable section 26.

The support section for the movable section 26 in the semiconductor acceleration sensor shown in FIG. 13 has a cross-link structure and the impurity diffusion resistance section 27 is formed in the cross-link sections. By measuring a resistance value of the impurity diffusion resistance section 27, the semiconductor acceleration sensor can detect a magnitude of acceleration applied to the semiconductor acceleration sensor itself with a high sensitivity.

In the semiconductor acceleration sensor shown in FIG. 14, a plurality of beam sections 26a, 26b are formed near to the support section for the movable section 26 and the impurity diffusion resistance sections 27a and 27b are formed in the beam sections 26a and 26b. In this configuration, it can be avoided to twist these beam sections 26a and 26b. Thereby, the semiconductor acceleration sensor can detect a magnitude of acceleration applied to the semiconductor acceleration sensor itself with a high sensitivity.

In the semiconductor acceleration sensor shown in FIG. 15, a plurality of impurity diffusion resistance sections, specifically the four diffusion resistance sections 27a, 27b, 27c and 27d, are formed near to the support section for the movable section 26. By using the four diffusion resistance sections 27a, 27b, 27c and 27d, a bridge circuit can be formed, so that the semiconductor acceleration sensor can detect a magnitude of acceleration applied to the semiconductor acceleration sensor itself with a high sensitivity.

Figure 16A:
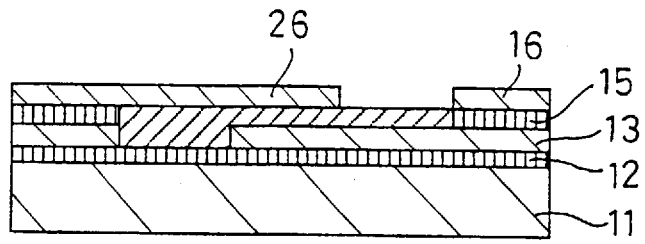
FIGS. 16A and 16B are explanation diagrams showing a fabrication method of the semiconductor acceleration sensor of the fifth embodiment according to the present invention.
Figure 16B:
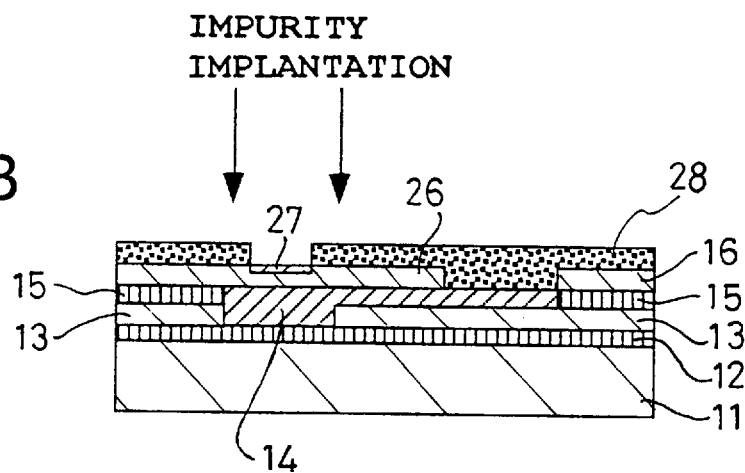

FIGS. 16A and 16B are explanation diagrams showing a fabrication method of the semiconductor acceleration sensor of the fifth embodiment according to the present invention. Specifically, FIGS. 16A and 16B show fabrication processes to form the diffusion resistance section 27 in the movable section 26.

FIG. 16A shows the fabrication process before an impurity implantation process and FIG. 16B shows the fabrication process after the impurity implantation process. The components in the semiconductor acceleration sensor of the fifth embodiment which are the same components of the semiconductor acceleration sensor of the first embodiment, as shown in FIGS. 2A to 2F, FIGS. 3A to 3F and FIGS. 4A to 4D, are also used in the same reference numbers and explanations for those components are omitted for brevity.

First, as shown in FIG. 16A, the movable electrode 26 is formed by etching the second poly-silicon layer 16, and then the surfaces of the first oxide film 14 and the second poly-silicon layer 16 are coated with a resist film 16. After etching the resist film on a part at which the impurity diffusion resistance section 27 will be formed to eliminate the resist film on this part, the impurity diffusion resistance section 27 is formed by diffusing impurity such as boron (B), phosphorus (P), arsenic (As), antimony (Sb) and the like according to application, for example.

As described above, in the semiconductor acceleration sensor of the fifth embodiment 5, the diffusion resistance sections 27, 27a to 27d whose resistance is changed according to a magnitude of acceleration applied to the semiconductor acceleration sensor are formed in a part of the movable electrode 26. Thereby, the semiconductor acceleration sensor can detect a magnitude of acceleration applied to the semiconductor acceleration sensor with a high sensitivity. In addition, because a plurality of beam sections 26a, 26b are formed near to the support section or the movable electrode 26, it can be avoided to twist these beam sections 26a and 26b. Thus, the present invention can provide the semiconductor acceleration sensor of a small sized structure and having a high impact strength.

Embodiment 6

Figure 17:
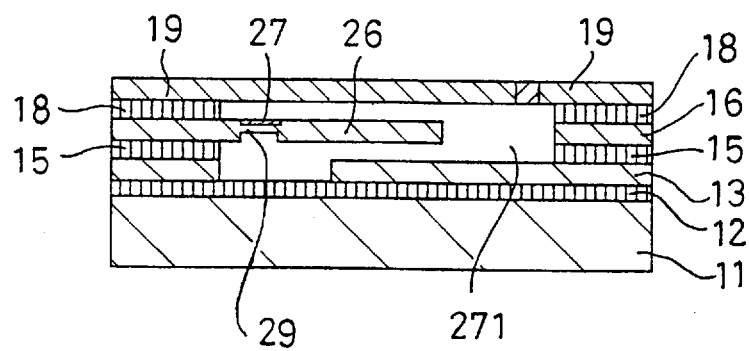
FIG. 17 is a sectional view of a semiconductor acceleration sensor of the sixth embodiment according to the present invention.

FIG. 17 is a sectional view of a semiconductor acceleration sensor of the sixth embodiment according to the present invention. In FIG. 17, reference number 29 designates a thin section formed under the lower section of the impurity diffusion resistance section 27 which is located near to the movable electrode 26. The thickness of the thin section 29 is thinner than that of the movable section 26. The components in the semiconductor acceleration sensor of the sixth embodiment which are the same components of the semiconductor acceleration sensor of the first embodiment, as shown in FIGS. 12 to 16A and FIG. 16B are also used in the same reference numbers and explanations for those components are omitted here for brevity.

In the semiconductor acceleration sensor of the sixth embodiment, the thin section 26 is formed under the bottom section of the impurity diffusion resistance section 27 which is formed near to a part of the movable electrode 26. Thereby, the semiconductor acceleration sensor can detect a magnitude of acceleration applied to the semiconductor acceleration sensor with a high sensitivity.

Next, the operation of the semiconductor acceleration sensor of the sixth embodiment will now be explained.

Since the thin section 29 is formed under the impurity diffusion resistance section 27 formed near to the movable electrode 26, a magnitude of acceleration applied to the semiconductor acceleration sensor can be detected with a high sensitivity.

FIGS. 18A to 18E are explanation diagrams showing a part of a fabrication method of the semiconductor acceleration sensor having the movable electrode 26, in which the thin section 29 shown in FIG. 17 is formed, of the sixth embodiment according to the present invention.

Figure 18A:
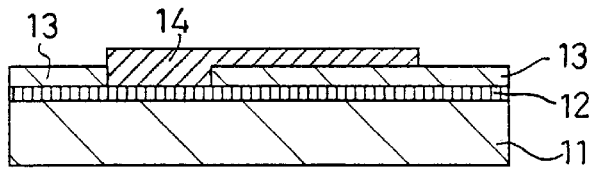
FIGS. 18A to 18E are explanation diagrams showing a part of a fabrication method of the semiconductor acceleration sensor of the sixth embodiment according to the present invention.
Figure 18B:
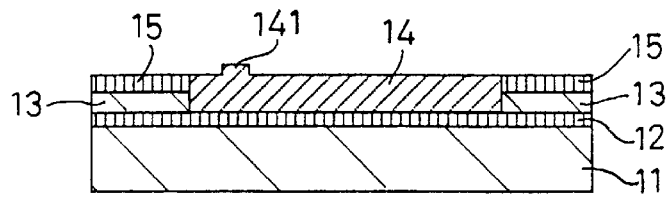

As shown in FIG. 18A, the first oxide film 14 is formed on a part of surfaces of the first nitride film 12 and the first poly-silicon layer 13. Then, a part at which a cavity section 171 will be formed is removed by etching. After this, the second nitride film 15 is formed on the surface of the first poly-silicon layer 13. The surfaces of the first oxide layer 14 and the second nitride film 15 deposed on the surface of the first oxide film 14 become uniform, namely have a same flatted surface by using an etching process so that both surfaces of the first oxide film 14 and the second nitride film 15 become flat or uniform. Then, a trapezoid-shaped section 141 is formed by etching the entire of the first oxide film 14 so that a part corresponding to the thin section 29 on the first oxide layer 14 is remained (see FIG. 18B).

Figure 18C:
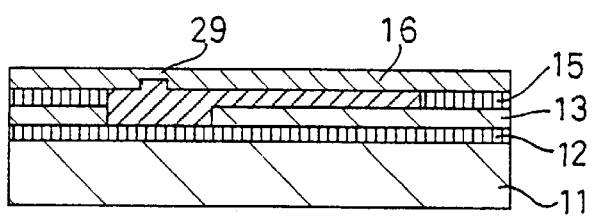

Furthermore, the second poly-silicon layer 16 is deposited on both the first oxide film 14 and the second nitride film 15 (see FIG. 18C).

Figure 18D:
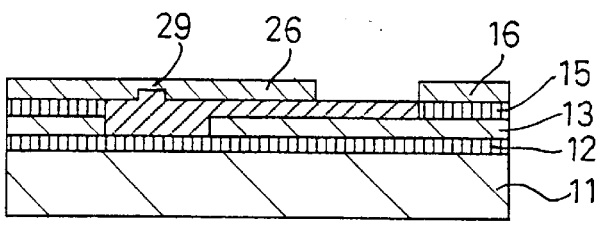
Figure 18E:
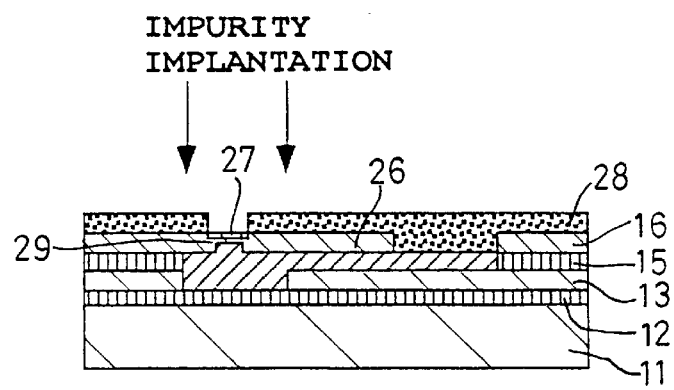

After this, the movable electrode 26 is formed by etching the second poly-silicon layer 16 (see FIG. 18D). Then, the movable electrode 26 as a part in the second poly-silicon layer 16 and the remained second poly-silicon layer 16 is coated with a resist film 28. After this, the resist film 28 corresponding to a part of the impurity diffusion resistance section 27 is removed and impurity is implanted so that the impurity diffusion resistance section 27 is formed (see FIG. 18E). The fabrication processes after this are omitted here for brevity because these fabrication processes are the same as those of the fabrication processes for the semiconductor acceleration sensor shown in FIG. 2 to FIG. 4.

As described above, in the semiconductor acceleration sensor of the embodiment 6, since the thin section 29 is formed under the lower section of the diffusion resistance section 27, the present invention can provide the semiconductor acceleration sensor having a small sized structure and having a high impact strength. Furthermore, the semiconductor acceleration sensor can detect a magnitude of acceleration applied to the semiconductor acceleration sensor.

Embodiment 7

Figure 19A:
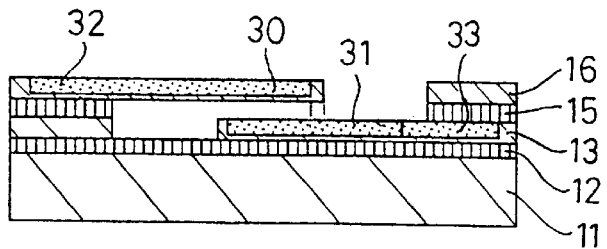
FIGS. 19A and 19B are a sectional view and a plan view of a semiconductor acceleration sensor of the seventh embodiment according to the present invention.
Figure 19B:
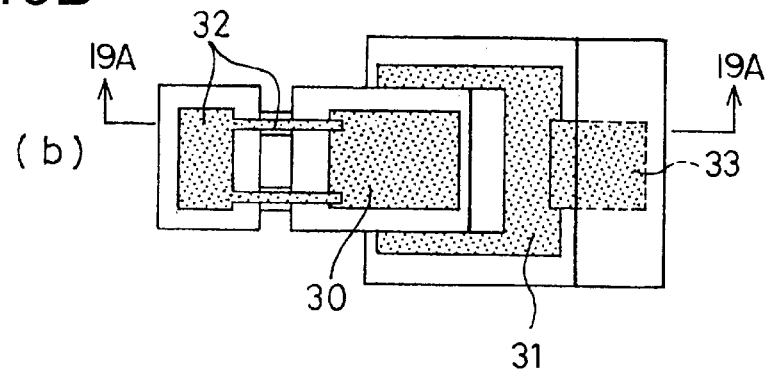
Figure 21A:
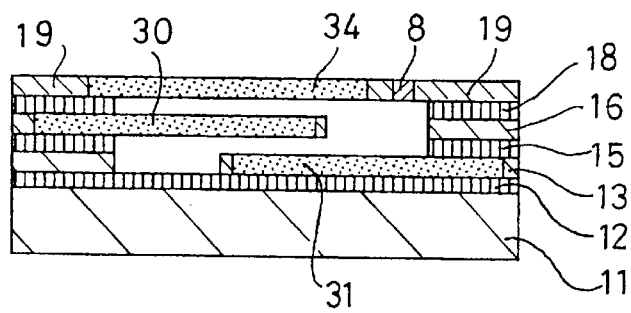
FIGS. 21A and 21B are a sectional view and a plan view of the semiconductor acceleration sensor shown in FIG. 17.
Figure 21B:
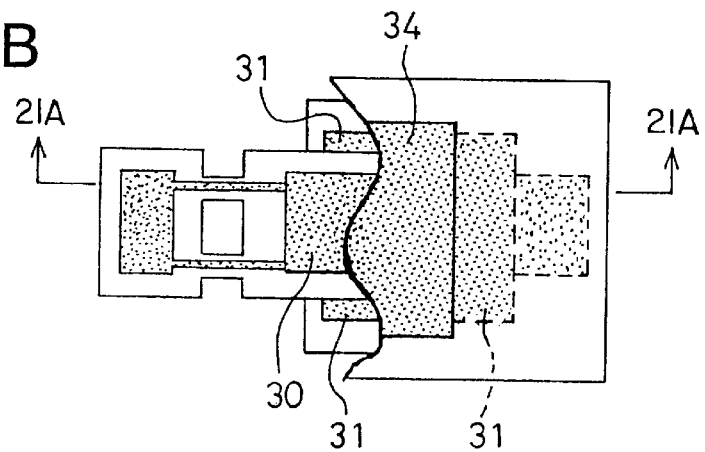

FIGS. 19A and 19B are a sectional view and a plan view of a semiconductor acceleration sensor of the seventh embodiment according to the present invention. FIGS. 21A and 21B are a sectional view and a plan view of the semiconductor acceleration sensor shown in FIG. 17. In the diagrams, the reference number 30 designates a movable electrode formed in a part of the second poly-silicon layer 16, 31 denotes a lower side fixed electrode, 32 and 33 denote wirings through which a signal transferred from the movable electrode 30 and the lower side fixed electrode 31 is transferred to outside devices (not shown). These wirings are formed by a diffusion process impurity into the first poly-silicon layer 13, the second poly-silicon layer 16 and the third poly-silicon layer 19. The reference number 34 designates an upper side fixed electrode formed in the third poly-silicon layer 19. The components in the semiconductor acceleration sensor of the seventh embodiment which are equal to the components of the semiconductor acceleration sensor of the first embodiment, as shown in FIG. 1, FIG. 2A to FIG. 2F, FIG. 3A to FIG. 3E, and FIG. 4A to FIG. 4D in configuration and operation are also used in the same reference numbers and explanations for those components are omitted here for brevity.

In the semiconductor acceleration sensor of the seventh embodiment, the upper side fixed electrode 34, the lower side fixed electrode 31, the movable electrode 30 and the wirings 32 and 33 are formed by diffusing impurity into the first poly-silicon layer 13 and the second poly-silicon layer 16. Thereby, the semiconductor acceleration sensor has a high impact strength and can detect a magnitude of acceleration applied to the semiconductor acceleration sensor with a high sensitivity.

Next, the operation of the semiconductor acceleration sensor of the seventh embodiment will now be explained.

The semiconductor acceleration sensor detects a magnitude of change of acceleration applied to the semiconductor acceleration sensor based on a magnitude of change of an electro-static capacitance generated between the movable electrode 30 and the upper side fixed electrode 34 and between the movable electrode 30 and the lower side fixed electrode 31 with a high sensitivity. Then, the semiconductor acceleration sensor transfers a signal generated based on the detected magnitude of acceleration to outside devices (not shown).

FIGS. 20A to 20F are explanation diagrams showing a fabrication method of the semiconductor acceleration sensor shown in FIG. 17. FIGS. 22A to 22E are explanation diagrams showing a fabrication method of the semiconductor acceleration sensor shown in FIGS. 19A and 19B and FIGS. 21A and 21B.

FIGS. 20A to 20F show the fabrication processes in which the lower side fixed electrode 31 and the movable electrode 30, FIGS. 22A to 22E show the fabrication processes in which the upper side fixed electrode 34 is formed by diffusing impurity into the third poly-silicon layer 19. The components in the semiconductor acceleration sensor of the seventh embodiment which are equal to the components of the semiconductor acceleration sensor of the first embodiment, as shown in FIG. 1, FIGS. 2A to 2F and FIGS. 3A to 3E, and FIGS. 4A to 4F in configuration and operation are also used in the same reference numbers and explanations for those components are omitted here for brevity.

Figure 20A:
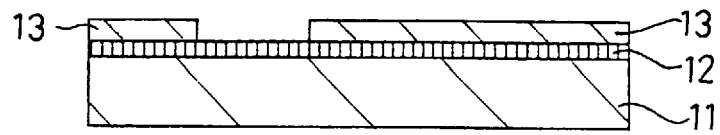
FIGS. 20A to 20F are explanation diagrams showing a fabrication method of the semiconductor acceleration sensor shown in FIG. 17.
Figure 20B:
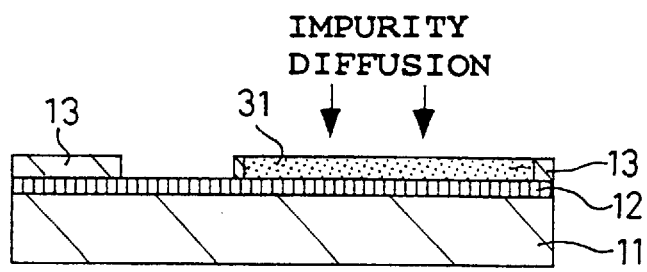

As shown in FIG. 20A, the first poly-silicon layer 13 is deposited on the first nitride film 12 deposited on the semiconductor silicon substrate 11. Then, a part of the first poly-silicon layer 13 is removed by an etching process. Next, the lower side fixed electrode 31 is formed by diffusing impurity into a part of the first poly-silicon layer 13 (see FIG. 20B).

Figure 20C:
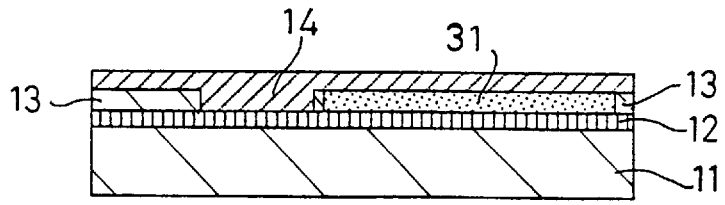
Figure 20D:
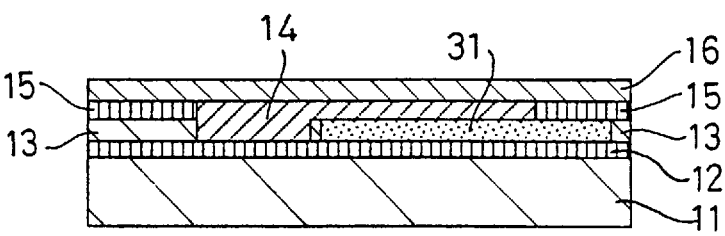
Figure 20E:
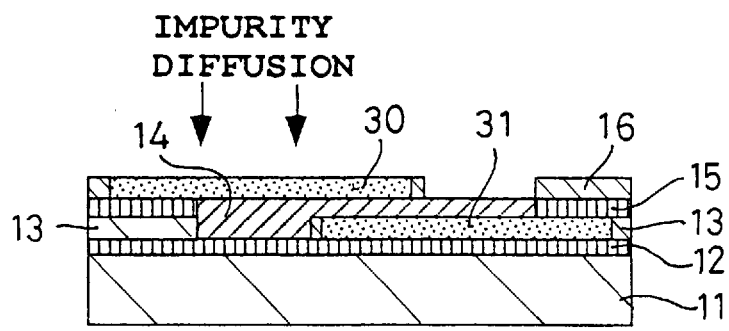
Figure 20F:
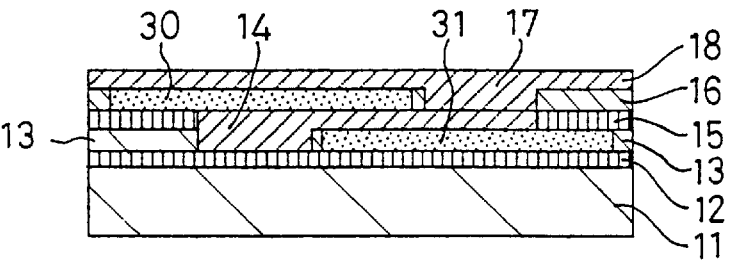

Next, after the first oxide film 14 is deposited on the first nitride film 12, the first poly-silicon layer 13, and the lower side fixed electrode 31 in the first poly-silicon layer 13 (see FIG. 20C). The first oxide film 14 is removed by etching the first oxide film 14 so that a cavity section is formed. Then, the second nitride film 15 is deposited on the first poly-silicon layer 13 and the lower side fixed electrode 31, and then the second nitride film 15 deposited on the first oxide film 14 is removed by using an etching process. Furthermore, the surfaces of the first oxide film 14 and the second nitride film 15 become uniform by using an etching process. Then, the second poly-silicon layer 16 is deposited on the flatted first oxide film 14 and the flatted second nitride film 15 (see FIG. 20D).

Next, a part of the second poly-silicon layer 16 is removed by etching in order to form the movable section as the movable electrode 30. Then, the movable electrode 30 is formed in the second poly-silicon layer 16 by diffusing impurity into the second poly-silicon layer 16 (see FIG. 20E).

After this process, the third nitride film 18 is deposited on the surfaces of the second poly-silicon layer 16 and the movable electrode 30.

Figure 22A:
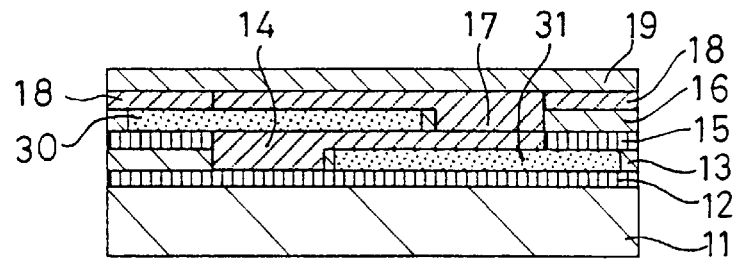
FIGS. 22A to 22E are explanation diagrams showing a fabrication method of the semiconductor acceleration sensor shown in FIG. 19.
Figure 22B:
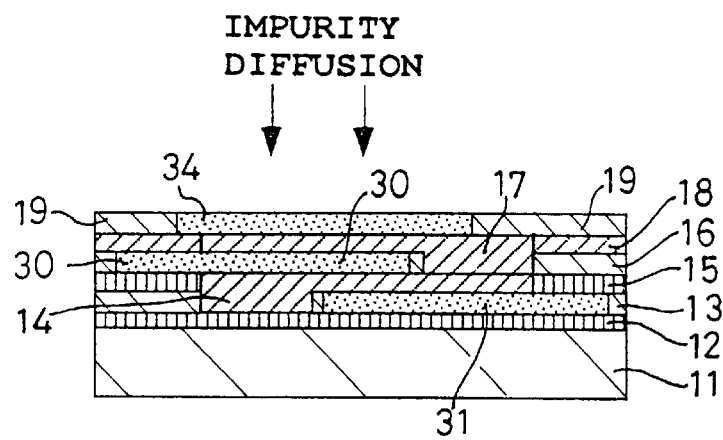
Figure 22C:
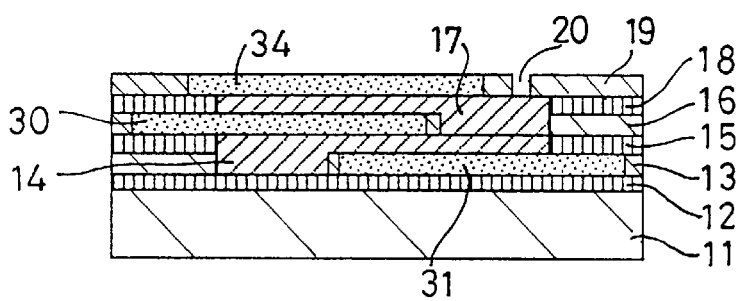
Figure 22D:
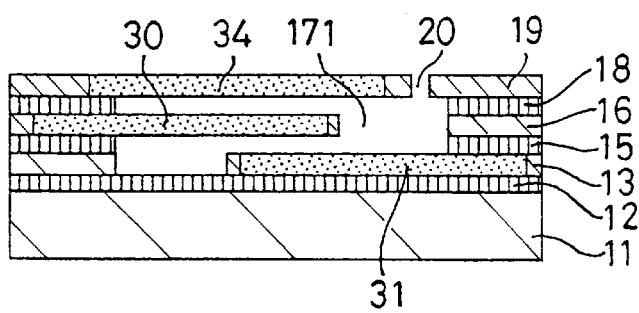
Figure 22E:
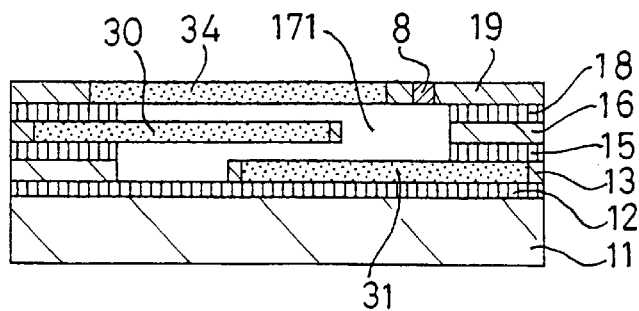

Next, as shown in FIGS. 22A to 22E, the third poly-silicon layer 19 is deposited on the surface of the third nitride film 18 (see FIG. 22A). Then, the upper side fixed electrode 34 is formed by diffusing impurity into the third poly-silicon layer 19 (see FIG. 22B).

Next, the etching hole 20 is formed in the third poly-silicon layer 19 (see FIG. 22C), the first oxide film 14 and the second oxide film 17 are removed through the etching hole 20 by using a fluorine vapor etching method. (see FIG. 22D).

Thereby, the lower side fixed electrode 31, the upper side fixed electrode 34 and the movable electrode 30 formed in the first poly-silicon layer 13, the second poly-silicon layer 16 and the third poly-silicon layer 19 can be formed in a single integral structure.

After this, the etching hole 20 is filled with a poly-silicon so that the cavity section 171 is sealed. Thereby, the fabrication process of the semiconductor acceleration sensor of the seventh embodiment is completed (see FIG. 22E).

As described above, the semiconductor acceleration sensor of the seventh embodiment has a high impact strength, has a small sized structure, and can detect a magnitude of change of acceleration applied to the semiconductor acceleration sensor with a high sensitivity, because the upper side fixed electrode 34, the lower side fixed electrode 31, the movable electrode 30 and the wirings 32 and 33 are formed by diffusing impurity into the first poly-silicon layer 13 and the second poly-silicon layer 16.

Embodiment 8

Figure 23A:
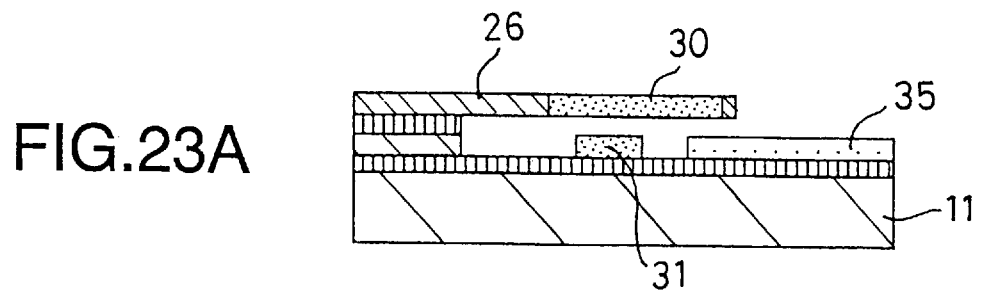
FIGS. 23A and 23B are a sectional view and a plan view of a semiconductor acceleration sensor of the eighth embodiment according to the present invention.
Figure 23B:
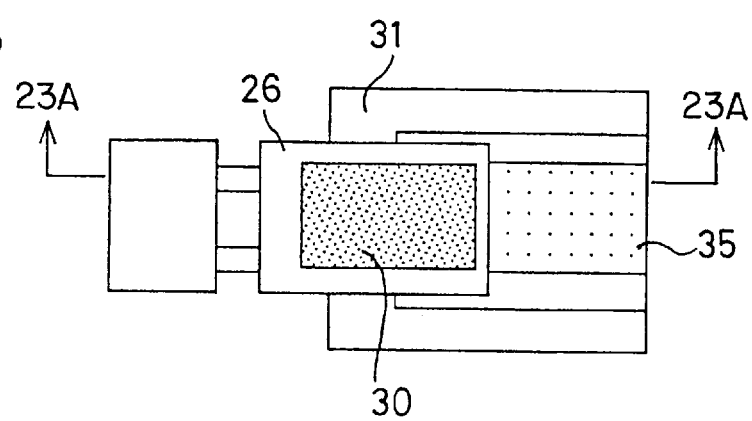

FIGS. 23A and 23B are a sectional view and a plan view of a semiconductor acceleration sensor of the eighth embodiment according to the present invention. In FIG. 23A and 23B, reference number 31 designates the lower side fixed electrode formed under the first poly-silicon layer 13, 35 denotes a driving electrode which is separated from the lower side fixed electrode 31 in distance.

The components in the semiconductor acceleration sensor of the eighth embodiment which are the same components of the semiconductor acceleration sensor of the first embodiment, as shown in FIG. 1, FIG. 2A to FIG. 2F, FIG. 3A to FIG. 3E, and FIG. 4A to FIG. 4D are also used in the same reference numbers and explanations for those components are omitted for brevity.

In the semiconductor acceleration sensor of the eighth embodiment, an electro-static force is generated between the driving electrode 35 and the movable electrode 30 when a voltage is applied to the driving electrode 35. The position of the movable electrode is changed according to a magnitude of the electro-static force. The lower side fixed electrode 31 detects the magnitude of the electro-static force to check whether or not the movable electrode 30 is damaged. Thus, the semiconductor acceleration sensor of the eighth embodiment has a self-checking function and checks the function, in advance.

Next, the operation of the semiconductor acceleration sensor of the eighth embodiment will now be explained.

The lower side fixed electrode 31 and the driving electrode 35 are formed in the first poly-silicon layer 13, the movable electrode 26 is formed in the second poly-silicon layer 16 and the movable electrode 30 is formed in the movable electrode 26. In this configuration, an electro-static force is generated between the driving electrode 35 and an movable electrode 30 and the position of the movable electrode 30 is changed corresponding to the magnitude of the electro-static force when a voltage is applied to the driving electrode 35.

The lower side fixed electrode 31 detects the magnitude of the change of the position of the movable electrode 30, so that the semiconductor acceleration sensor can detect whether or not the movable electrode 30 has been damaged, in advance.

As described above, in the semiconductor acceleration sensor of the eighth embodiment, a damage of the movable electrode 30 can be detected by measuring the magnitude of the electro-static force generated between the movable electrode 30 and the driving electrode 35 when a voltage is applied to the driving electrode 35. Thus, the present invention can provide the semiconductor acceleration sensor of a small sized structure having a self-checking function and a high impact strength.

Embodiment 9

Figure 24A:
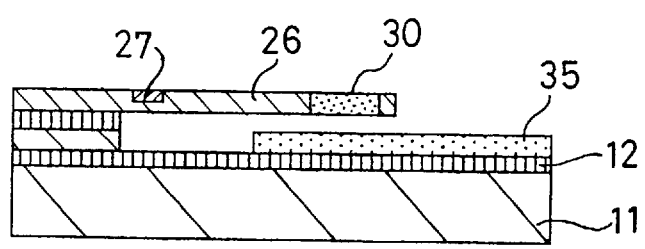
FIGS. 24A and 24B are a sectional view and a plan view of a semiconductor acceleration sensor of the ninth embodiment according to the present invention.
Figure 24B:
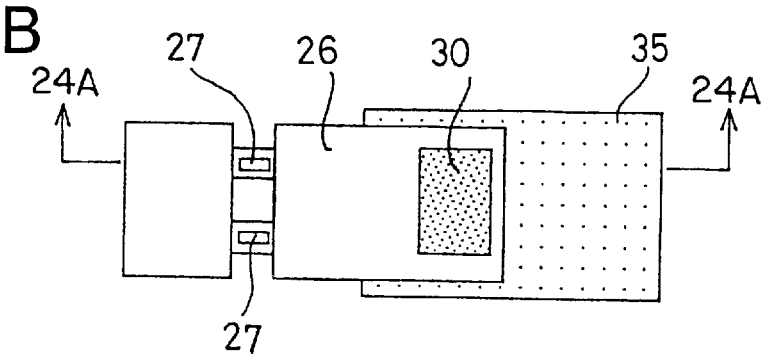

FIGS. 24A and 24B are a sectional view and a plan view of a semiconductor acceleration sensor of the ninth embodiment according to the present invention.

The components in the semiconductor acceleration sensor of the ninth embodiment which are equal to the components of the semiconductor acceleration sensor of the first embodiment, as shown in FIG. 1, FIG. 2A to FIG. 2F, FIG. 3A to FIG. 3E, and FIG. 4A to FIG. 4D in configuration and operation are also used in the same reference numbers and explanations for those components are omitted here for brevity.

In the semiconductor acceleration sensor of the ninth embodiment, an electro-static force is generated when a voltage is applied to the driving electrode 35. The electro-static force changes a position of the movable electrode 26. Then, an impurity diffusion resistance section 27 detects the magnitude of change of the position of the movable electrode 26. Thereby, the semiconductor acceleration sensor of the ninth embodiment has a self-checking function to detect a damage of the movable electrode 26, in advance.

Next, the operation of the semiconductor acceleration sensor of the ninth embodiment will now be explained.

The driving electrode 35 is formed in the first poly-silicon layer 13, the movable electrode 26 is formed in the second poly-silicon layer 16 and the movable electrode 30 is formed in the movable electrode 26. For example, an electro-static force is generated between the driving electrode 35 and the movable electrode 30 and the position of the movable electrode 30 is changed corresponding to the magnitude of an electro-static force when a voltage is applied to the driving electrode 35 in order to check the function of the semiconductor acceleration sensor itself. The impurity diffusion resistance section 27 detects this magnitude of change of the position of the movable electrode 30 to check whether or not there is a damage in the movable electrode 30.

As described above, in the semiconductor acceleration sensor of the ninth embodiment, an electro-static force is generated between the movable electrode 30 and the driving electrode 35 and the position of the movable electrode 30 is changed corresponding to the magnitude of the electro-static force when a voltage is applied to the driving electrode 35. The impurity diffusion resistance section 27 detects this magnitude of change of the position of the movable electrode 30, the semiconductor acceleration sensor can detect whether or not there is a damage in the movable electrode 30. Thus, the present invention can provide the semiconductor acceleration sensor of a small sized structure having a self-checking function and a high impact strength.

Embodiment 10

Figure 25A:
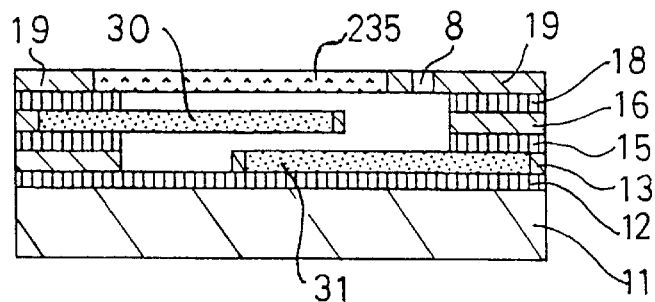
FIGS. 25A and 25B are a sectional view and a plan view of a semiconductor acceleration sensor of the tenth embodiment according to the present invention.
Figure 25B:
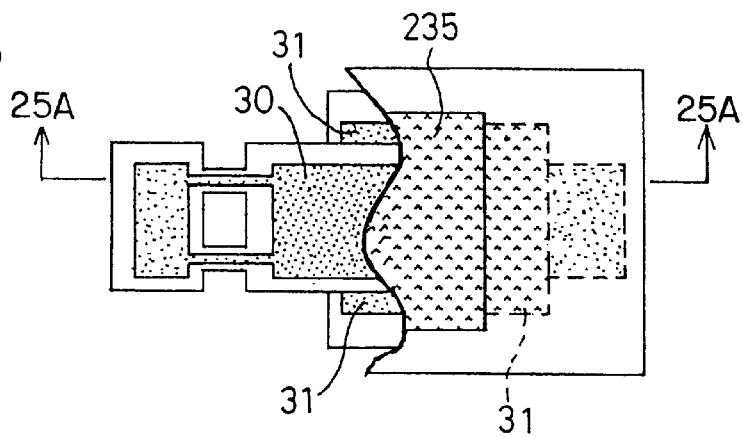

FIGS. 25A and 25B are a sectional view and a plan view of a semiconductor acceleration sensor of the tenth embodiment according to the present invention. In FIGS. 25A and 25B, the reference number 235 designates a driving electrode formed in a part section of the third poly-silicon layer 19. The components in the semiconductor acceleration sensor of the tenth embodiment which are equal to the components of the semiconductor acceleration sensor of the first and seventh embodiments, as shown in FIG. 1, FIG. 2A to FIG. 2F, FIG. 3A to FIG. 3E, FIG. 4A to FIG. 4D and FIG. 21A and FIG. 21B in configuration and operation are also used in the same reference numbers and explanations for these components are omitted here for brevity.

In the semiconductor acceleration sensor of the tenth embodiment, an electro-static force is generated between the movable electrode 30 and the driving electrode 235 and between the lower side fixed electrode 31 and the movable electrode 30 when a voltage is applied to the driving electrode 235. Thereby, a position of the movable electrode 30 as the movable section is changed. The lower side fixed electrode 31 detects the magnitude of change of the position of the movable electrode 30 to perform a self-checking operation whether or not there is a damage in the movable electrode 30 as the movable section.

Next, the operation of the semiconductor acceleration sensor of the tenth embodiment will now be explained.

The movable electrode 30 is formed in the second poly-silicon layer 16, the lower side fixed electrode 31 is formed in the first poly-silicon layer 13, and the driving electrode 23 is formed in the third poly-silicon layer 19. In this configuration, an electro-static force is generated between the movable electrode 30 and the driving electrode 235 and between the lower side fixed electrode 31 and the movable electrode 30 when a voltage is applied to the driving electrode 235. The electro-static force changes the position of the movable electrode 30. The lower side fixed electrode 31 detects the magnitude of change of the electro-static capacity generated by the change of the electro-static capacitance between the movable electrode 30 and the lower side fixed electrode 31 which is formed under the lower side fixed electrode 31.

As described above, in the semiconductor acceleration sensor of the tenth embodiment, an electro-static force is generated between the movable electrode 30 and the driving electrode 235 and between the lower side fixed electrode 31 and the movable electrode 30 when a voltage is applied to the driving electrode 235. The lower side fixed electrode 31 detects the magnitude of change of the position of the movable electrode 30 caused by the electro-static force. Thereby, the semiconductor acceleration sensor can detect whether or not there is a damage in the movable section 30. Thus, the present invention can provide the semiconductor acceleration sensor of a small sized structure having a self-checking function and a high impact strength.

Embodiment 11

Figure 26A:
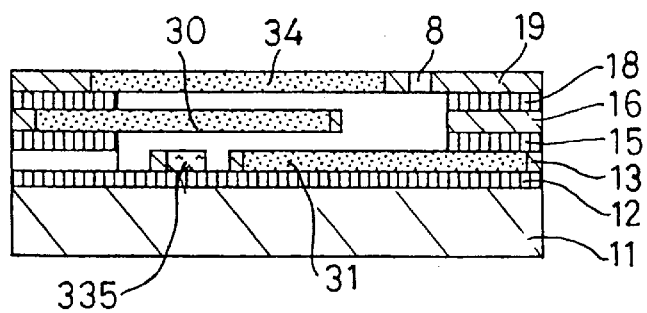
FIGS. 26A and 26B are a sectional view and a plan view of a semiconductor acceleration sensor of the eleventh embodiment according to the present invention.
Figure 26B:
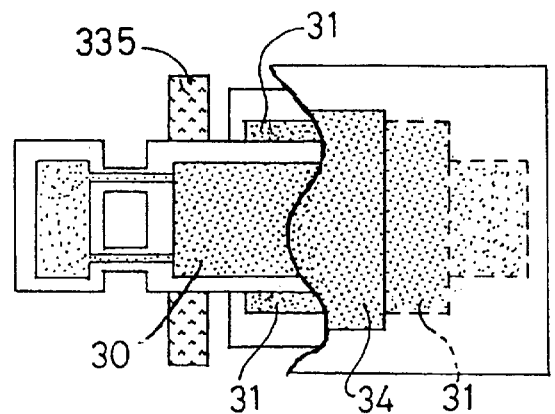

FIGS. 26A and 26B are a sectional view and a plan view of a semiconductor acceleration sensor of the eleventh embodiment according to the present invention. In FIGS. 26A and 26B, the reference number 335 designates a driving electrode, whose position is separated from the lower side fixed electrode 31 in distance, formed in a part of the first poly-silicon layer 13. The components in the semiconductor acceleration sensor of the eleventh embodiment which are equal to the components of the semiconductor acceleration sensor of the first, seventh and tenth embodiments, as shown in FIG. 1, FIG. 2A to FIG. 2F, FIG. 3A to FIG. 3E, FIG. 4A to FIG. 4D, FIG. 21A and FIG. 21B and FIGS. 25A and 25B in configuration and operation are also used in the same reference numbers and explanations for those components are omitted here for brevity.

In the semiconductor acceleration sensor of the eleventh embodiment, an electro-static force is generated between the movable electrode 30 and the driving electrode 335 and between the lower side fixed electrode 31 and the movable electrode 30 when a voltage is applied to the driving electrode 335. The electro-static force changes a position of the movable electrode 30 as the movable section. The lower side fixed electrode 31 and the upper side fixed electrode 34 detect the magnitude of change of the position of the movable electrode 30 in order to perform a self-checking operation whether or not there is a damage in the movable electrode 30.

Next, the operation of the semiconductor acceleration sensor of the tenth embodiment will now be explained.

The movable electrode 30 is formed in the second poly-silicon layer 16 and the lower side fixed electrode 31 and the driving electrode 335 are formed in the first poly-silicon layer 13. The driving electrode 335 is formed so that it is separated from the lower side fixed electrode 31 in distance. The upper side fixed electrode 34 is formed in the third poly-silicon layer 19.

An electro-static force is generated between the movable electrode 30 and the lower side fixed electrode 31 and between the upper side fixed electrode 34 and the movable electrode 30 when a voltage is applied to the driving electrode 335. The electro-static force changes a position of the movable electrode 30 as the movable section. Both the lower side fixed electrode 31 and the upper side fixed electrode 34 detect the magnitude of change of the position of the movable electrode 30 by measuring the magnitude of an electro-static capacitance caused by the change of the position of the movable section 30.

As described above, in the semiconductor acceleration sensor of the eleventh embodiment, an electro-static force is generated between the movable electrode 30 and the lower side fixed electrode 31 and between the movable electrode 30 and the lower side fixed electrode 31 when a voltage is applied to the driving electrode 235. The lower side fixed electrode 31 or the upper side fixed electrode 34 detects the magnitude of change of the position of the movable electrode 30 caused by the electro-static force. Thereby, the semiconductor acceleration sensor of the eleventh embodiment can detect whether or not there is a damage in the movable section 30. Thus, the present invention can provide the semiconductor acceleration sensor of a small sized structure having a self-checking function and a high impact strength.

Embodiment 12

FIGS. 27A to 27D are explanation diagrams showing a fabrication method of semiconductor acceleration sensor chips of the twelfth embodiment according to the present invention. FIGS. 28A to 28D are explanation diagrams showing a fabrication method of semiconductor acceleration sensor chips of the twelfth embodiment according to the present invention. In the diagrams, the reference number 36 designates lead frames, 37 denotes wire bindings, 39 indicates a semiconductor acceleration sensor of the embodiment described above, 40 indicates a semiconductor acceleration sensor in which the semiconductor acceleration sensor and a CMOS circuit and the like are formed in a single integral structure, and 38 designates a resin mold by which the semiconductor acceleration sensors 39 and 40 are sealed in a package.

In the semiconductor acceleration sensor chip of the embodiment 12, the semiconductor acceleration sensor in the embodiments 1 to 11 is formed in a package by sealing them with a resin mold.

Next, the operation of the semiconductor acceleration sensor of the eleventh embodiment will now be explained.

Figure 27A:
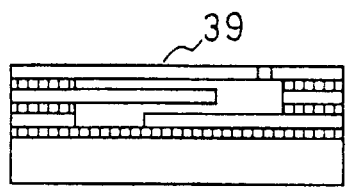
FIGS. 27A to 27D are explanation diagrams showing a fabrication method of semiconductor acceleration sensor chips of the twelfth embodiment according to the present invention.
Figure 27B:
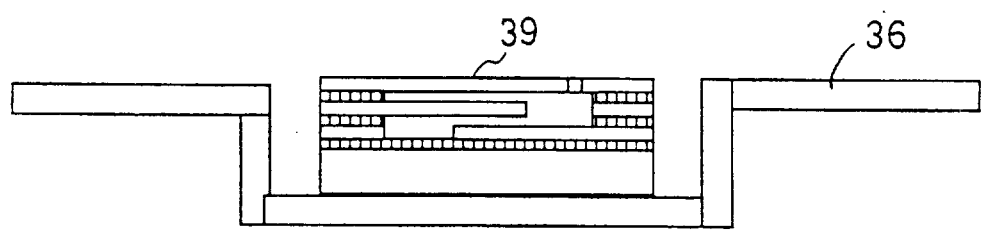
Figure 27C:
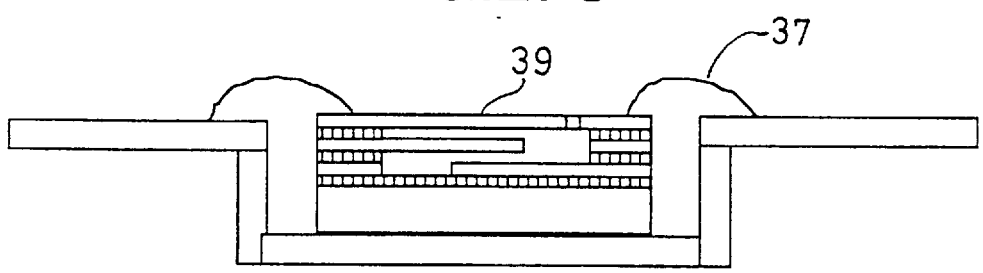
Figure 27D:
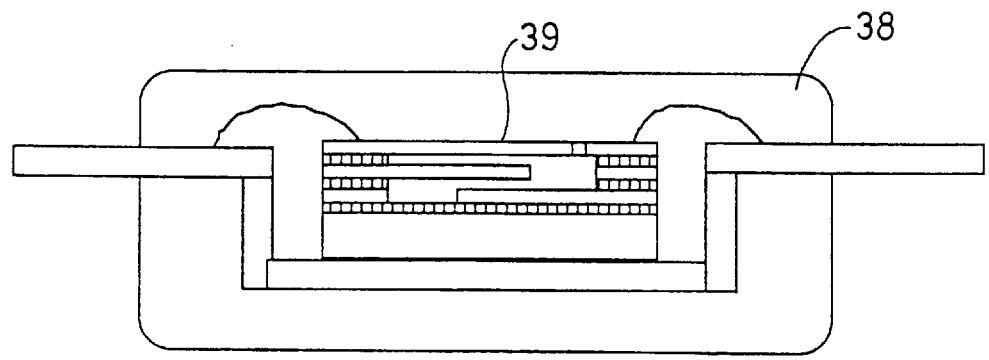
Figure 28A:
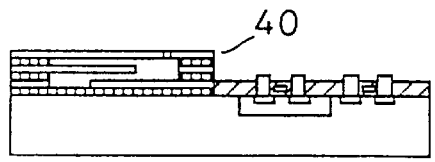
FIGS. 28A to 28D are explanation diagrams showing a fabrication method of semiconductor acceleration sensor chips of the twelfth embodiment according to the present invention.
Figure 28B:
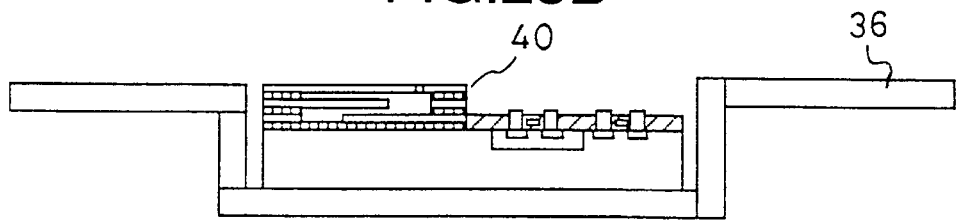
Figure 28C:
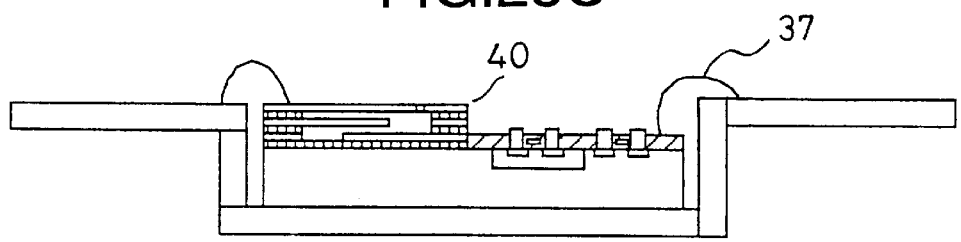
Figure 28D:
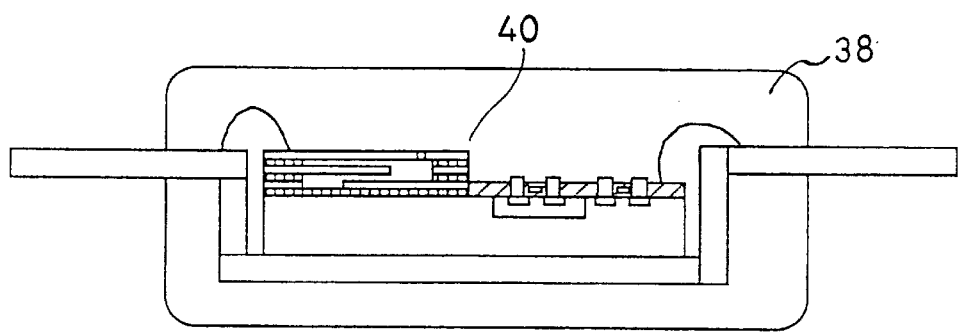

As shown in FIGS. 27A to 27D and FIG. 28A to 28D, the semiconductor acceleration sensors 39 and the semiconductor acceleration sensor 40 having the semiconductor integrated circuit are connected electrically (see FIGS. 27C and 28C) to the lead frames 36 after the semiconductor acceleration sensor 39 and 40 are placed on the lead frames 36 (see FIG. 27B and 28B).

The semiconductor acceleration sensors 39 and 40 are completely sealed with a resin mold so that the small sized semiconductor acceleration sensor chips of a single integral structure and a high impact strength.

The operations of the semiconductor acceleration sensors 39 and 40 have been explained in the explanation of the first to eleventh embodiments, therefore those explanation are omitted here for brevity.

As described above, according to the semiconductor acceleration sensor chip of the eleventh embodiment, the package fabrication cost can be reduced because the semiconductor acceleration sensor of each of the first to eleventh embodiments is formed in a package so that the semiconductor acceleration sensor chip has the configuration of a single integral structure. Thereby, the present invention can provide the semiconductor acceleration sensor chip of a small sized structure and a high impact strength.

As described in detail, the present invention has the effect that the semiconductor acceleration sensor of a small sized structure has the function of a high impact strength and can detect a magnitude of acceleration applied to the semiconductor acceleration sensor with a high sensitivity because the first insulating layer, the first poly-silicon layer, the second insulating layer, the second poly-silicon layer, the third insulating layer, and the third poly-silicon layer are formed in a single integral structure and a part of the second poly-silicon layer in the cavity section which is sealed is used as a movable section.

In addition, the present invention has the effect that a semiconductor acceleration sensor can be formed efficiently in a single integral structure with a high yield rate because a first insulating layer, a first poly-silicon layer, a first oxide film, a second insulating layer, a second poly-silicon layer, a second oxide film, a third insulating layer and a third poly-silicon layer are formed in order by using a semiconductor fine-fabrication processes, the first oxide film and the second oxide film are removed through an etching hole by using an etching process at the same time in order to form a movable section in a cavity section, and finally, the etching hole is sealed in order to seal the cavity section.

Furthermore, the present invention has the effect that a semiconductor integrated circuit can receive output transferred from a semiconductor acceleration sensor directly and immediately and can process this output efficiently because the semiconductor acceleration device has a configuration in which the semiconductor acceleration sensor and the integrated circuit are formed in a same semiconductor substrate in a single integral structure.

In addition, the present invention has the effect that a semiconductor acceleration sensor can detect a magnitude of acceleration applied to the semiconductor acceleration sensor with a high sensitivity because the magnitude of an electro-static capacity between a movable electrode and a fixed electrode is detected.

Furthermore, the present invention has the effect that the effect caused by twisting the movable section can be eliminated and a magnitude of acceleration applied to the semiconductor acceleration sensor can be detected with a high sensitivity because the semiconductor acceleration sensor has a configuration in which one end section of the movable section is supported by a pair of cross-link sections.

In addition, the present invention has the effect that a magnitude of acceleration applied to a semiconductor acceleration sensor can be detected with a high sensitivity because the semiconductor acceleration sensor having a configuration in which a left movable electrode and a right movable electrode are formed at both end sections of the second poly-silicon layer, a left fixed electrode and a right fixed electrode are formed in the first poly-silicon layer corresponding to the left movable electrode and the right movable electrode, respectively, and the movable section as an intermediate section of the second poly-silicon layer is supported by the second insulating layer.

Furthermore, the present invention has the effect that a magnitude of acceleration applied to a semiconductor acceleration sensor can be further detected with a high sensitivity because the semiconductor acceleration sensor having a configuration in which four-end sections of the movable electrode are supported by a plurality of supporting sections.

In addition, the present invention has the effect that a magnitude of acceleration applied to a semiconductor acceleration sensor can be detected based on the magnitude of change of an electro-static capacitance between the movable electrode and the upper side fixed electrode and between the movable electrode and the lower side fixed electrode, because the semiconductor acceleration sensor having a configuration in which the lower side fixed electrode is formed at a part of the first poly-silicon layer at a position corresponding to the movable electrode and then upper side fixed electrode is formed at a part of the third poly-silicon layer at an upper side position and a lower side position corresponding to the movable electrode.

Furthermore, the present invention has the effect that the magnitude of acceleration applied to a semiconductor acceleration sensor is detected with a high sensitivity based on a magnitude of change of a resistance value of the impurity diffusion resistance section, because the semiconductor acceleration sensor having a configuration in which an impurity diffusion resistance section is formed at a part of the movable section.

Moreover, the present invention has the effect that the magnitude of acceleration applied to a semiconductor acceleration sensor is detected with a high sensitivity, because the semiconductor acceleration sensor having a configuration in which a thickness of the impurity diffusion resistance section is thinner, as a thinner section, than a thickness of a section in the second poly-silicon layer in which no impurity diffusion resistance section is formed and a resistance value of the diffusion resistance section is measured.

Furthermore, the present invention has the effect that a magnitude of acceleration applied to a semiconductor acceleration sensor can be detected based on the magnitude of change of an electro-static capacitance between a movable electrode and an upper side fixed electrode and between the movable electrode and a lower side fixed electrode with a high sensitivity, because the semiconductor acceleration sensor having a configuration in which the lower side fixed electrode is formed in the first poly-silicon layer, the movable electrode is formed in the second poly-silicon layer, the upper side fixed electrode is formed in the third poly-silicon layer, and wirings are formed in the first poly-silicon layer, the second poly-silicon layer and the third poly-silicon layer by diffusing impurity.

Moreover, the present invention has the effect that a semiconductor acceleration sensor has a self-checking function and detects a damage of a movable electrode based on the magnitude of change of an electro-static capacitance between the movable electrode and a fixed electrode generated when a voltage is applied to the driving electrode, because the semiconductor acceleration sensor having a configuration in which a driving electrode separated from the fixed electrode in the first poly-silicon layer in distance is formed in the first poly-silicon layer.

In addition, the present invention has the effect that a semiconductor acceleration sensor has a self-checking function and can easily detect a damage of a movable electrode by measuring the magnitude of change of a resistance value of the impurity diffusion resistance section when a voltage is applied to the fixed electrode, because the semiconductor acceleration sensor has a configuration in which an impurity diffusion resistance section is formed in a second poly-silicon layer by diffusing impurity, and a fixed electrode as a driving electrode is formed in a first poly-silicon layer.

Moreover, the present invention has the effect that a semiconductor acceleration sensor has a self-checking function and can easily detect a damage of a movable electrode by measuring the magnitude of change of an electro-static capacitance between the movable electrode and the fixed electrode formed in the first poly-silicon layer when a voltage is applied to the driving electrode, because the semiconductor acceleration sensor having a configuration in which the driving electrode is formed in the third poly-silicon electrode.

Furthermore, the present invention has the effect that a semiconductor acceleration sensor has a self-checking function and can detect a damage of the movable electrode by measuring the magnitude of change of an electro-static capacitance between the movable electrode and an upper side fixed electrode and between the movable electrode and a lower side fixed electrode when a voltage is applied to the driving electrode, because the semiconductor acceleration sensor having a configuration in which wirings are formed by diffusing impurity in the first poly-silicon layer, the second poly-silicon layer and the third poly-silicon layer and the driving electrode separated from the lower side fixed electrode is formed in the first poly-silicon layer.

Moreover, the present invention ash the effect that a semiconductor acceleration sensor chip can be formed with a small-sized structure and a high impact strength because the semiconductor acceleration sensor chip has the configuration in which a semiconductor acceleration sensor or a semiconductor acceleration sensor and an integrated circuit are formed in a same semiconductor substrate in a single integral structure in which lead frames are connected to the semiconductor acceleration sensor by wire bonds and the semiconductor acceleration sensor, the semiconductor integrated circuit, the wire bonds and the lead frames are sealed by a resin mold in a package.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A semiconductor acceleration sensor comprising:

a semiconductor substrate;

a first insulating layer formed on a surface of the semiconductor substrate;

a first poly-silicon layer formed on a surface of the first insulating layer;

a second insulating layer formed on a surface of the first poly-silicon layer;

a second poly-silicon layer formed on a surface of the second insulating layer;

a third insulating layer formed on a surface of the second poly-silicon layer; and a third poly-silicon layer formed on a surface of the third insulating layer, wherein a part of the second poly-silicon layer, is disposed in a cavity, said cavity being enclosed and sealed by the first insulating layer, the first poly-silicon layer, the second insulating layer, the second poly-silicon layer, the third insulating layer, and the third poly-silicon layer, and said part of the second poly-silicon layer is formed as a movable section spaced movably apart from said first poly-silicon layer which is static.

2. A semiconductor acceleration device comprising:

the semiconductor acceleration sensor as claimed in claim 1; and an integrated circuit section for processing signals proportion to a magnitude of acceleration transferred from the semiconductor acceleration sensor.

3. A semiconductor acceleration sensor comprising:

a semiconductor substrate;

a first insulating layer formed on a surface of the semiconductor substrate;

a first poly-silicon layer formed on a surface of the first insulating layer;

a second insulating layer formed on a surface of the first poly-silicon layer;

a second poly-silicon layer formed on a surface of the second insulating layer;

a third insulating layer formed on a surface of the second poly-silicon layer; and a third poly-silicon layer formed on a surface of the third insulating layer, wherein a part of the second poly-silicon layer in a cavity enclosed and sealed by the first insulating layer, the first poly-silicon layer, the second insulating layer, the second poly-silicon layer, the third insulating layer, and the third poly-silicon layer, and said part of the second poly-silicon layer is formed as a movable section; and wherein a movable electrode is formed at a part of the movable section in the second poly-silicon layer and a fixed electrode is formed at a part of the first poly-silicon layer, a magnitude of acceleration is detected based on a magnitude of change of an electro-static capacitance between the movable electrode and the fixed electrode.

4. A semiconductor acceleration sensor as claimed in claim 1, wherein one end section of the movable section is supported by a pair of cross-link support sections.

5. A semiconductor acceleration sensor as claimed in claim 3, wherein an intermediate section of the second poly-silicon layer is supported by the second insulating layer, a left movable electrode and a right movable electrode are formed at both end sections of the second poly-silicon layer in the cavity section, and a left fixed electrode and a right fixed electrode are formed in the first poly-silicon layer corresponding to the left movable electrode and the right movable electrode, respectively.

6. A semiconductor acceleration sensor as claimed in claim 3, wherein four-end sections of the movable electrode are supported by a plurality of supporting sections, which enclose the movable electrode, formed in the second poly-silicon layer.

7. A semiconductor acceleration sensor comprising:

a semiconductor substrate;

a first insulating layer formed on a surface of the semiconductor substrate;

a first poly-silicon layer formed on a surface of the first insulating layer;

a second insulating layer formed on a surface of the first poly-silicon layer;

a second poly-silicon layer formed on a surface of the second insulating layer;

a third insulating layer formed on a surface of the second poly-silicon layer; and a third poly-silicon layer formed on a surface of the third insulating layer, wherein a part of the second poly-silicon layer in a cavity enclosed and sealed by the first insulating layer, the first poly-silicon layer, the second insulating layer, the second poly-silicon layer, the third insulating layer, and the third poly-silicon layer, and said part of the second poly-silicon layer is formed as a movable section; and wherein a movable electrode is formed at a part of the movable section in the second poly-silicon layer, a lower side fixed electrode is formed at a part of the first poly-silicon layer at a position corresponding to the movable electrode, an upper side fixed electrode is formed at a part of the third poly-silicon layer at a position corresponding to the movable electrode, and a magnitude of acceleration applied to the semiconductor acceleration sensor is detected based on a magnitude of change of an electro-static capacitance between the movable electrode and the upper side fixed electrode and between the movable electrode and the lower side fixed electrode.

8. A semiconductor acceleration sensor as claimed in claim 1, wherein a movable electrode is formed at a part of the movable section in the second poly-silicon layer, and an impurity diffusion resistance section are also formed at a part of the movable section in the second poly-silicon layer by diffusing impurity, and a magnitude of acceleration applied to the semiconductor acceleration sensor is detected based on a magnitude of change of a resistance value of the impurity diffusion resistance section.

9. A semiconductor acceleration sensor as claimed in claim 3, wherein a movable electrode and an impurity diffusion resistance section formed by diffusing impurity are formed at a part of the movable section in the second poly-silicon layer, and a magnitude of acceleration applied to the semiconductor acceleration sensor is detected based on a magnitude of change of a resistance value of the impurity diffusion resistance section.

10. A semiconductor acceleration sensor as claimed in claim 7, wherein a movable electrode and an impurity diffusion resistance section formed by diffusing impurity are formed at a part of the movable section in the second poly-silicon layer, and a magnitude of acceleration applied to the semiconductor acceleration sensor is detected based on a magnitude of change of a resistance value of the impurity diffusion resistance section.

11. A semiconductor acceleration sensor as claimed in claim 8, wherein a thickness of the impurity diffusion resistance section is thinner, as a thinner section, than a thickness of a section in the second poly-silicon layer in which no impurity diffusion resistance section is formed.

12. A semiconductor acceleration sensor as claimed in claim 9, wherein a thickness of the impurity diffusion resistance section is thinner, as a thinner section, than a thickness of a section in the second poly-silicon layer in which no impurity diffusion resistance section is formed.

13. A semiconductor acceleration sensor as claimed in claim 10, wherein a thickness of the impurity diffusion resistance section is thinner, as a thinner section, than a thickness of a section in the second poly-silicon layer in which no impurity diffusion resistance section is formed.

14. A semiconductor acceleration sensor comprising:

a semiconductor substrate;

a first insulating layer formed on a surface of the semiconductor substrate;

a first poly-silicon layer formed on a surface of the first insulating layer;

a second insulating layer formed on a surface of the first poly-silicon layer;

a second poly-silicon layer formed on a surface of the second insulating layer;

a third insulating layer formed on a surface of the second poly-silicon layer; and a third poly-silicon layer formed on a surface of the third insulating layer, wherein a part of the second poly-silicon layer in a cavity enclosed and sealed by the first insulating layer, the first poly-silicon layer, the second insulating layer, the second poly-silicon layer, the third insulating layer, and the third poly-silicon layer, and said part of the second poly-silicon layer is formed as a movable section, wherein a movable electrode is formed at a part of the movable section in the second poly-silicon layer, a lower side fixed electrode is formed at a part of the first poly-silicon layer at a position corresponding to the movable electrode, an upper side fixed electrode is formed at a part of the third poly-silicon layer at a position corresponding to the movable electrode, and wirings are formed in the first poly-silicon layer, the second poly-silicon layer and the third poly-silicon layer by diffusing impurity and connected to the upper side fixed electrode and the lower side fixed electrode, and wherein a magnitude of acceleration applied to the semiconductor acceleration device is detected based on a magnitude of change of an electro-static capacitance between the movable electrode and the upper side fixed electrode and between the movable electrode and the lower side fixed electrode.

15. A semiconductor acceleration sensor comprising:

a semiconductor substrate;

a first insulating layer formed on a surface of the semiconductor substrate;

a first poly-silicon layer formed on a surface of the first insulating layer;

a second insulating layer formed on a surface of the first poly-silicon layer;

a second poly-silicon layer formed on a surface of the second insulating layer;

a third insulating layer formed on a surface of the second poly-silicon layer; and a third poly-silicon layer formed on a surface of the third insulating layer, wherein a part of the second poly-silicon layer in a cavity enclosed and sealed by the first insulating layer, the first poly-silicon layer, the second insulating layer, the second poly-silicon layer, the third insulating layer, and the third poly-silicon layer, and said part of the second poly-silicon layer is formed as a movable section, wherein a movable electrode is formed at a part of the movable section in the second poly-silicon layer, a fixed electrode is formed in the first poly-silicon layer, a driving electrode separated from the fixed electrode in the first poly-silicon layer in distance is formed in the first poly-silicon layer, and wherein the semiconductor acceleration sensor has a self-checking function and a damage of the movable electrode is detected based on a magnitude of change of an electro-static capacitance between the movable electrode and the fixed electrode generated when a voltage is applied to the driving electrode.

16. A semiconductor acceleration sensor comprising:

a semiconductor substrate;

a first insulating layer formed on a surface of the semiconductor substrate;

a first poly-silicon layer formed on a surface of the first insulating layer;

a second insulating layer formed on a surface of the first poly-silicon layer;

a second poly-silicon layer formed on a surface of the second insulating layer;

a third insulating layer formed on a surface of the second poly-silicon layer; and a third poly-silicon layer formed on a surface of the third insulating layer, wherein a part of the second poly-silicon layer in a cavity enclosed and sealed by the first insulating layer, the first poly-silicon layer, the second insulating layer, the second poly-silicon layer, the third insulating layer, and the third poly-silicon layer, and said part of the second poly-silicon layer is formed as a movable section, wherein a movable electrode is formed at a part of the movable section in the second poly-silicon layer, an impurity diffusion resistance section is formed by diffusing impurity in a part of the movable section, a fixed electrode is formed in the first poly-silicon layer, and wherein the semiconductor acceleration sensor has a self-checking function and a damage of the movable electrode is detected by measuring a magnitude of change of a resistance value of the impurity diffusion resistance section when a voltage is applied to the fixed electrode.

17. A semiconductor acceleration sensor as claimed in claim 14, wherein the semiconductor acceleration sensor has a self-checking function and a damage of the movable electrode is detected by measuring a magnitude of change of an electro-static capacitance between the movable electrode and the upper side fixed electrode and between the movable electrode and the lower side fixed electrode when a voltage is applied to the fixed electrode.

18. A semiconductor acceleration sensor as claimed in claim 14, wherein the lower side fixed electrode is formed and a driving electrode separated from the lower side fixed electrode in distance is formed in the first poly-silicon layer, wherein the semiconductor acceleration sensor has a self-checking function and a damage of the movable electrode is detected by measuring a magnitude of change of an electro-static capacitance between the movable electrode and the upper side fixed electrode and between the movable electrode and the lower side fixed electrode when a voltage is applied to the driving electrode.

19. A semiconductor acceleration sensor chip comprising:

the semiconductor acceleration sensor as claimed in claim 1; and lead frames connected to the semiconductor acceleration sensor by wire bonds, wherein the semiconductor acceleration sensor, the wire bonds and the lead frames are sealed by a resin mold.

* * * * *